United States Patent
Qi et al.

(10) Patent No.: US 12,538,837 B2
(45) Date of Patent: Jan. 27, 2026

(54) DISPLAY SYSTEMS HAVING MONOLITHIC ARRAYS OF LIGHT-EMITTING DIODES

(71) Applicant: Apple Inc., Cupertino, CA (US)

(72) Inventors: Jun Qi, San Jose, CA (US); Rong Liu, Sunnyvale, CA (US); Saijin Liu, San Jose, CA (US); Shaofeng Liu, Santa Clara, CA (US); Tongbi T. Jiang, Santa Clara, CA (US); Victor H. Yin, Cupertino, CA (US); Xia Li, San Jose, CA (US); Xiang Fang, San Jose, CA (US); Ziruo Hong, San Jose, CA (US)

( * ) Notice: Subject to any disclaimer, the term of this patent is extended or adjusted under 35 U.S.C. 154(b) by 619 days.

(21) Appl. No.: 17/475,831

(22) Filed: Sep. 15, 2021

(65) Prior Publication Data
US 2022/0005798 A1    Jan. 6, 2022

Related U.S. Application Data

(63) Continuation of application No. PCT/US2020/063554, filed on Dec. 7, 2020.
(Continued)

(51) Int. Cl.
*H01L 25/16* (2023.01)
*G02B 27/01* (2006.01)
(Continued)

(52) U.S. Cl.
CPC ........ *H01L 25/167* (2013.01); *G02B 27/0172* (2013.01); *H01L 24/13* (2013.01);
(Continued)

(58) Field of Classification Search
CPC .............. H01L 25/167; H01L 25/0753; H01L 2224/48137; H01L 2224/24137;
(Continued)

(56) References Cited

U.S. PATENT DOCUMENTS

| 9,278,545 B2 | 3/2016 | Kang |
| 2010/0032701 A1* | 2/2010 | Fudeta ................... H01L 33/46 438/31 |

(Continued)

FOREIGN PATENT DOCUMENTS

WO   2016105284 A1   6/2016

OTHER PUBLICATIONS https://www.prpopto.com/wp-content/uploads/2018/08/Monolithic-LED-Arrays-Technology-Overview-20160616.pdf (Year:2018).*

(Continued)

*Primary Examiner* — Lawrence C Tynes, Jr.
(74) *Attorney, Agent, or Firm* — Treyz Law Group, P.C.; Michael H. Lyons; Jinie M. Guihan

(57) ABSTRACT

An electronic device may include a display having a monolithic array of light-emitting diodes mounted to a surface of a substrate layer. The diodes may include contact pads. Driver circuitry may independently drive each of the diodes in the array using drive signals. The driver circuitry may be formed on a driver integrated circuit. Bond pads may be formed on a surface of the integrated circuit. Copper pillars may be grown on the bond pads. In another suitable arrangement, the driver circuitry may be formed on a driver printed circuit board coupled to an interposer by a flexible printed circuit. The interposer may include bond pads and copper pillars grown on the bond pads. The contact pads on each of the diodes may be simultaneously bonded to the copper pillars. A surface of the substrate layer may be patterned to form light redirecting elements if desired.

22 Claims, 17 Drawing Sheets

Related U.S. Application Data

(60) Provisional application No. 62/948,062, filed on Dec. 13, 2019.

(51) Int. Cl.
 H01L 23/00 (2006.01)
 H10H 20/857 (2025.01)

(52) U.S. Cl.
 CPC .............. H01L 24/16 (2013.01); H01L 24/73 (2013.01); H10H 20/857 (2025.01); *G02B 2027/0174* (2013.01); *G02B 2027/0178* (2013.01); *H01L 2224/13147* (2013.01); *H01L 2224/16148* (2013.01); *H01L 2224/73204* (2013.01)

(58) Field of Classification Search
 CPC ...... H01L 2924/12041; G02B 27/0172; G02B 2027/0174; G02B 2027/0178; H10H 20/819; H10H 29/30; H10H 29/012; G02F 1/133603; G02F 1/13336; G02F 1/133305; G02F 1/133608; H10K 59/40; H10K 59/12; H10K 59/17; H10K 77/111; H10K 77/10
 See application file for complete search history.

(56) References Cited

U.S. PATENT DOCUMENTS

| | | | |
|---|---|---|---|
| 2011/0299044 A1* | 12/2011 | Yeh ........................ | H04N 9/315 353/52 |
| 2013/0049053 A1* | 2/2013 | Kususe ................... | H01L 33/38 257/E33.072 |
| 2013/0207071 A1 | 8/2013 | Fong et al. | |
| 2013/0306996 A1 | 11/2013 | Kitazawa et al. | |
| 2019/0044040 A1* | 2/2019 | Andrews ................ | H05B 45/24 |
| 2019/0066571 A1* | 2/2019 | Goward ............ | H01L 23/49827 |
| 2019/0074266 A1* | 3/2019 | Andrews ................ | H01L 23/60 |
| 2019/0198564 A1* | 6/2019 | Tandon .............. | H10H 20/8512 |

OTHER PUBLICATIONS

Choi et al., GaN micro-light-emitting diode arrays with monolithically integrated sapphire microlenses, Applied Physics Letters, Mar. 23, 2004, vol. 84, Issue 13, American Institute of Physics, United States.

\* cited by examiner

DISPLAY SYSTEMS HAVING MONOLITHIC ARRAYS OF LIGHT-EMITTING DIODES

This application is a continuation of International Patent Application No. PCT/US2020/063554, filed Dec. 7, 2020, which claims priority to U.S. Provisional Patent Application No. 62/948,062, filed Dec. 13, 2019, which are hereby incorporated by reference herein in their entireties.

BACKGROUND

This relates generally to optical systems and, more particularly, to optical systems for displays.

Electronic devices may include displays that present images close to a user's eyes. For example, devices such as virtual reality and augmented reality headsets may include displays with optical elements that allow users to view the displays.

It can be challenging to design devices such as these. If care is not taken, the components used in displaying content may be bulky and may not exhibit desired levels of optical performance and power consumption.

SUMMARY

An electronic device such as a head-mounted device may have one or more near-eye displays that produce images for a user. The head-mounted device may be a pair of virtual reality glasses or may be an augmented reality headset that allows a viewer to view both computer-generated images and real-world objects in the viewer's surrounding environment.

The near-eye display may include a display module that generates light and an optical system that redirects the light from the display module towards an eye box. The display module may include an illumination engine and a spatial light modulator such as a reflective display panel. The illumination engine may include a monolithic array of light-emitting diodes mounted to a surface of a substrate layer. The light-emitting diodes may include contact pads. The illumination engine may include driver circuitry that independently drives each of the light-emitting diodes in the array using drive signals.

The driver circuitry may be formed on a driver integrated circuit. Bond pads may be formed on a surface of the driver integrated circuit. Copper pillars may be grown on the bond pads of the driver integrated circuit. The contact pads on each of the light-emitting diodes in the array may be simultaneously bonded to the copper pillars on the driver integrated circuit (e.g., in a flip-chip configuration). In another suitable arrangement, the driver circuitry may be formed on a driver printed circuit board. The driver printed circuit board may be coupled to an interposer by a flexible printed circuit. The interposer may include bond pads and copper pillars grown on the bond pads. The contact pads on each of the light-emitting diodes in the array may be simultaneously bonded to the copper pillars on the interposer.

A surface of the substrate layer may be patterned to form light redirecting elements. For example, the surface may be patterned to form an array of microlenses or other structures that break up a total internal reflection mode of the substrate layer. The surface may be patterned to form lens elements that help to focus the light. The surface may be patterned to form protruding structures or trenches that help to collimate the light.

DETAILED DESCRIPTION

Figure 1:
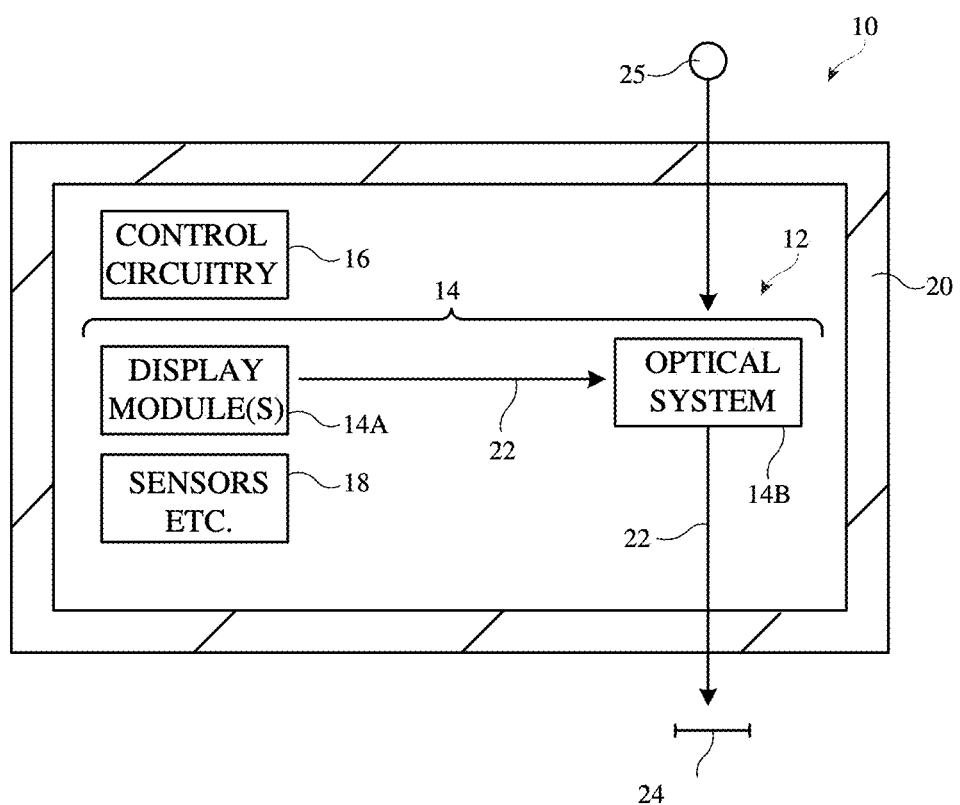
FIG. 1 is a diagram of an illustrative system having a display in accordance with some embodiments.

An illustrative system having a device with one or more near-eye display systems is shown in FIG. 1. System 10 may be a head-mounted device having one or more displays such as near-eye displays 14 mounted within support structure (housing) 20. Support structure 20 may have the shape of a pair of eyeglasses (e.g., supporting frames), may form a housing having a helmet shape, or may have other configurations to help in mounting and securing the components of near-eye displays 14 on the head or near the eye of a user. Near-eye displays 14 may include one or more display modules such as display modules 14A and one or more optical systems such as optical systems 14B. Display modules 14A may be mounted in a support structure such as support structure 20. Each display module 14A may emit light 22 (image light) that is redirected towards a user's eyes at eye box 24 using an associated one of optical systems 14B.

The operation of system 10 may be controlled using control circuitry 16. Control circuitry 16 may include storage and processing circuitry for controlling the operation of system 10. Circuitry 16 may include storage such as hard disk drive storage, nonvolatile memory (e.g., electrically-programmable-read-only memory configured to form a solid state drive), volatile memory (e.g., static or dynamic random-access-memory), etc. Processing circuitry in control circuitry 16 may be based on one or more microprocessors, microcontrollers, digital signal processors, baseband processors, power management units, audio chips, graphics processing units, application specific integrated circuits, and other integrated circuits. Software code (instructions) may be stored on storage in circuitry 16 and run on processing circuitry in circuitry 16 to implement operations for system 10 (e.g., data gathering operations, operations involving the adjustment of components using control signals, image rendering operations to produce image content to be displayed for a user, etc.).

System 10 may include input-output circuitry such as input-output devices 12. Input-output devices 12 may be used to allow data to be received by system 10 from external equipment (e.g., a tethered computer, a portable device such as a handheld device or laptop computer, or other electrical equipment) and to allow a user to provide head-mounted device 10 with user input. Input-output devices 12 may also be used to gather information on the environment in which system 10 (e.g., head-mounted device 10) is operating. Output components in devices 12 may allow system 10 to provide a user with output and may be used to communicate with external electrical equipment. Input-output devices 12 may include sensors and other components 18 (e.g., image sensors for gathering images of real-world object that are digitally merged with virtual objects on a display in system 10, accelerometers, depth sensors, light sensors, haptic output devices, speakers, batteries, wireless communications circuits for communicating between system 10 and external electronic equipment, etc.). In one suitable arrangement that is sometimes described herein as an example, components 18 may include gaze tracking sensors that gather gaze image data from a user's eye at eye box 24 to track the direction of the user's gaze in real time. As an example, the gaze tracking sensors may include infrared or other light emitters that emit infrared light or other light towards the eye box and image sensors that sense the infrared or other light reflected off of the user's eye (e.g., where the sensed light identifies the gaze direction of the user's eye).

Display modules 14A may include reflective displays (e.g., liquid crystal on silicon (LCOS) displays, digital-micromirror device (DMD) displays, or other spatial light modulators), emissive displays (e.g., micro-light-emitting diode (uLED) displays, organic light-emitting diode (OLED) displays, laser-based displays, etc.), or displays of other types. Light sources in display modules 14A may include uLEDs, OLEDs, LEDs, mini LEDs, lasers, combinations of these, or any other desired light-emitting components.

Optical systems 14B may form lenses that allow a viewer (see, e.g., a viewer's eyes at eye box 24) to view images on display(s) 14. There may be two optical systems 14B (e.g., for forming left and right lenses) associated with respective left and right eyes of the user. A single display 14 may produce images for both eyes or a pair of displays 14 may be used to display images. In configurations with multiple displays (e.g., left and right eye displays), the focal length and positions of the lenses formed by components in optical system 14B may be selected so that any gap present between the displays will not be visible to a user (e.g., so that the images of the left and right displays overlap or merge seamlessly).

If desired, optical system 14B may contain components (e.g., an optical combiner, etc.) to allow real-world image light from real-world images or objects 25 to be combined optically with virtual (computer-generated) images such as virtual images in image light 22. In this type of system, which is sometimes referred to as an augmented reality system, a user of system 10 may view both real-world content and computer-generated content that is overlaid on top of the real-world content. Camera-based augmented reality systems may also be used in device 10 (e.g., in an arrangement which a camera captures real-world images of object 25 and this content is digitally merged with virtual content at optical system 14B).

System 10 may, if desired, include wireless circuitry and/or other circuitry to support communications with a computer or other external equipment (e.g., a computer that supplies display 14 with image content). During operation, control circuitry 16 may supply image content to display 14. The content may be remotely received (e.g., from a computer or other content source coupled to system 10) and/or may be generated by control circuitry 16 (e.g., text, other computer-generated content, etc.). The content that is supplied to display 14 by control circuitry 16 may be viewed by a viewer at eye box 24.

Figure 2:
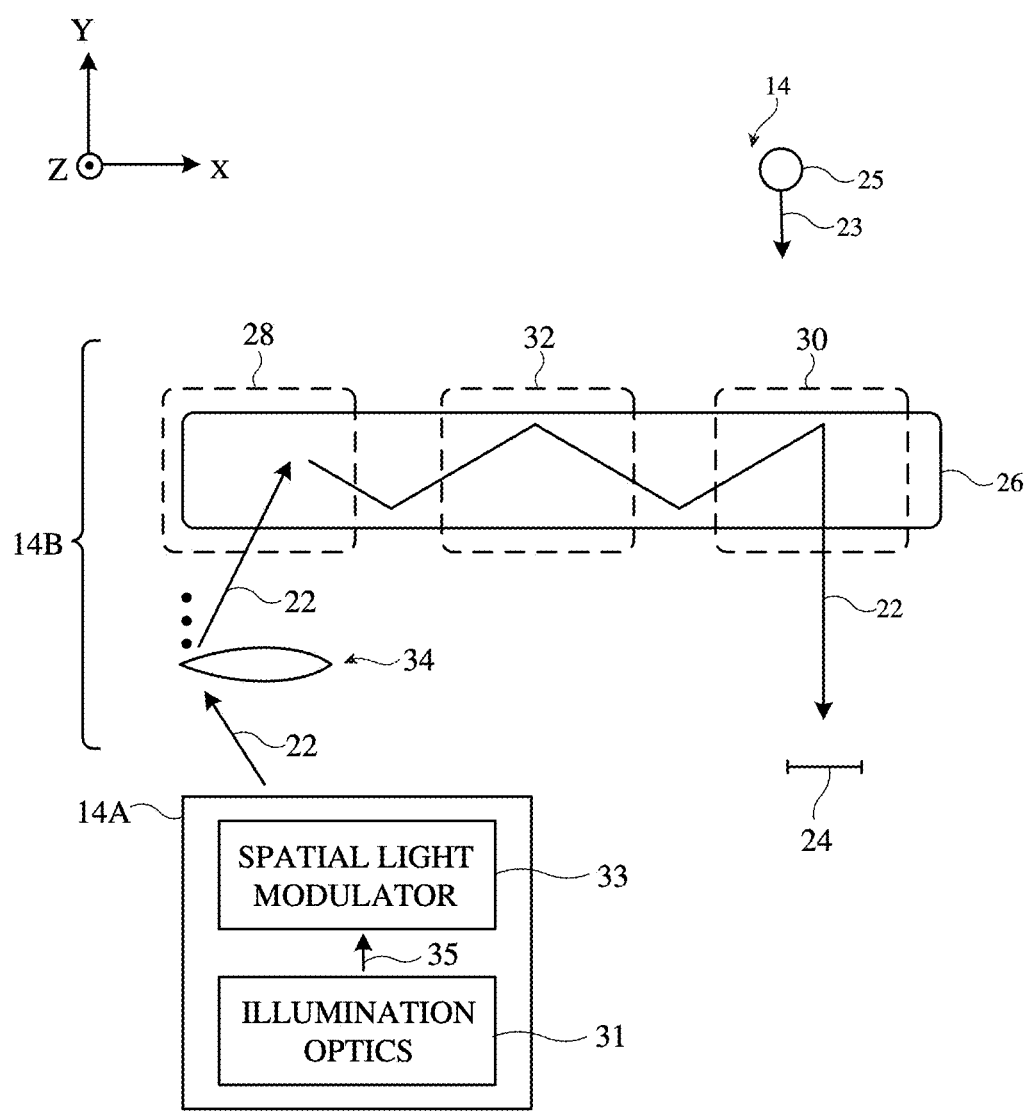
FIG. 2 is a top view of an illustrative optical system having a display module for providing light to an eye box in accordance with some embodiments.

FIG. 2 is a top view of an illustrative display 14 that may be used in system 10 of FIG. 1. As shown in FIG. 2, near-eye display 14 may include one or more display modules such as display module 14A and an optical system such as optical system 14B. Optical system 14B may include optical elements such as one or more waveguides 26. Waveguide 26 may include one or more stacked substrates (e.g., stacked planar and/or curved layers sometimes referred to herein as waveguide substrates) of optically transparent material such as plastic, polymer, glass, etc.

If desired, waveguide 26 may also include one or more layers of holographic recording media (sometimes referred to herein as holographic media, grating media, or diffraction grating media) on which one or more diffractive gratings are recorded (e.g., holographic phase gratings, sometimes referred to herein as holograms). A holographic recording may be stored as an optical interference pattern (e.g., alternating regions of different indices of refraction) within a photosensitive optical material such as the holographic media. The optical interference pattern may create a holographic phase grating that, when illuminated with a given light source, diffracts light to create a three-dimensional reconstruction of the holographic recording. The holographic phase grating may be a non-switchable diffractive grating that is encoded with a permanent interference pattern or may be a switchable diffractive grating in which the diffracted light can be modulated by controlling an electric field applied to the holographic recording medium. Multiple holographic phase gratings (holograms) may be recorded within (e.g., superimposed within) the same volume of holographic medium if desired. The holographic phase gratings may be, for example, volume holograms or thin-film holograms in the grating medium. The grating media may include photopolymers, gelatin such as dichromated gelatin, silver halides, holographic polymer dispersed liquid crystal, or other suitable holographic media.

Diffractive gratings on waveguide 26 may include holographic phase gratings such as volume holograms or thin-film holograms, meta-gratings, or any other desired diffractive grating structures. The diffractive gratings on waveguide 26 may also include surface relief gratings formed on one or more surfaces of the substrates in waveguides 26, gratings formed from patterns of metal structures, etc. The diffractive gratings may, for example, include multiple multiplexed gratings (e.g., holograms) that at least partially overlap within the same volume of grating medium (e.g., for diffracting different colors of light and/or light from a range of different input angles at one or more corresponding output angles).

Optical system 14B may include collimating optics such as imaging optics 34. Imaging optics 34 (sometimes referred to herein as imaging lens 34) may include one or more lens elements that help direct image light 22 towards waveguide 26. If desired, display module 14A may be mounted within support structure 20 of FIG. 1 while optical system 14B may be mounted between portions of support structure 20 (e.g., to form a lens that aligns with eye box 24). Other mounting arrangements may be used, if desired.

As shown in FIG. 2, display module 14A may generate light 22 associated with image content to be displayed to eye box 24. Light 22 may be collimated using a lens such as a lens in imaging optics 34. Optical system 14B may be used to present light 22 output from display module 14A to eye box 24.

Optical system 14B may include one or more optical couplers such as input coupler 28, cross-coupler 32, and output coupler 30. In the example of FIG. 2, input coupler 28, cross-coupler 32, and output coupler 30 are formed at or on waveguide 26. Input coupler 28, cross-coupler 32, and/or output coupler 30 may be completely embedded within the substrate layers of waveguide 26, may be partially embedded within the substrate layers of waveguide 26, may be mounted to waveguide 26 (e.g., mounted to an exterior surface of waveguide 26), etc.

The example of FIG. 2 is merely illustrative. One or more of these couplers (e.g., cross-coupler 32) may be omitted. Optical system 14B may include multiple waveguides that are laterally and/or vertically stacked with respect to each other. Each waveguide may include one, two, all, or none of couplers 28, 32, and 30. Waveguide 26 may be at least partially curved or bent if desired.

Waveguide 26 may guide light 22 down its length via total internal reflection. Input coupler 28 may be configured to couple light 22 from display module 14A (imaging optics 34) into waveguide 26, whereas output coupler 30 may be configured to couple light 22 from within waveguide 26 to the exterior of waveguide 26 and towards eye box 24. For example, display module 14A may emit light 22 in direction +Y towards optical system 14B. When light 22 strikes input coupler 28, input coupler 28 may redirect light 22 so that the light propagates within waveguide 26 via total internal reflection towards output coupler 30 (e.g., in direction X). When light 22 strikes output coupler 30, output coupler 30 may redirect light 22 out of waveguide 26 towards eye box 24 (e.g., back along the Y-axis). In scenarios where cross-coupler 32 is formed at waveguide 26, cross-coupler 32 may redirect light 22 in one or more directions as it propagates down the length of waveguide 26, for example.

Input coupler 28, cross-coupler 32, and/or output coupler 30 may be based on reflective and refractive optics or may be based on holographic (e.g., diffractive) optics. In arrangements where couplers 28, 30, and 32 are formed from reflective and refractive optics, couplers 28, 30, and 32 may include one or more reflectors (e.g., an array of micromirrors, partial mirrors, or other reflectors). In arrangements where couplers 28, 30, and 32 are based on holographic optics, couplers 28, 30, and 32 may include diffractive gratings (e.g., volume holograms, surface relief gratings, etc.).

Display module 14A may include arrays of light sources such as light-emitting diodes (e.g., LEDs, OLEDs, uLEDs, mini LEDs, etc.). In one suitable arrangement that is described herein as an example, display module 14A may include a spatial light modulator such as spatial light modulator 33 and an illumination engine such as illumination engine 31. Illumination engine 31 may generate illumination light 35. Spatial light modulator 33 may spatially modulate illumination light 35 to produce image light 22 (e.g., using images to be displayed by the image light). The arrays of light sources in display module 14A may be formed in illumination engine 31 and may produce illumination light 35. Spatial light modulator 33 may be a transmissive or reflective spatial light modulator. An example in which spatial light modulator 33 is a reflective spatial light modulator is described herein as an example.

Figure 3:
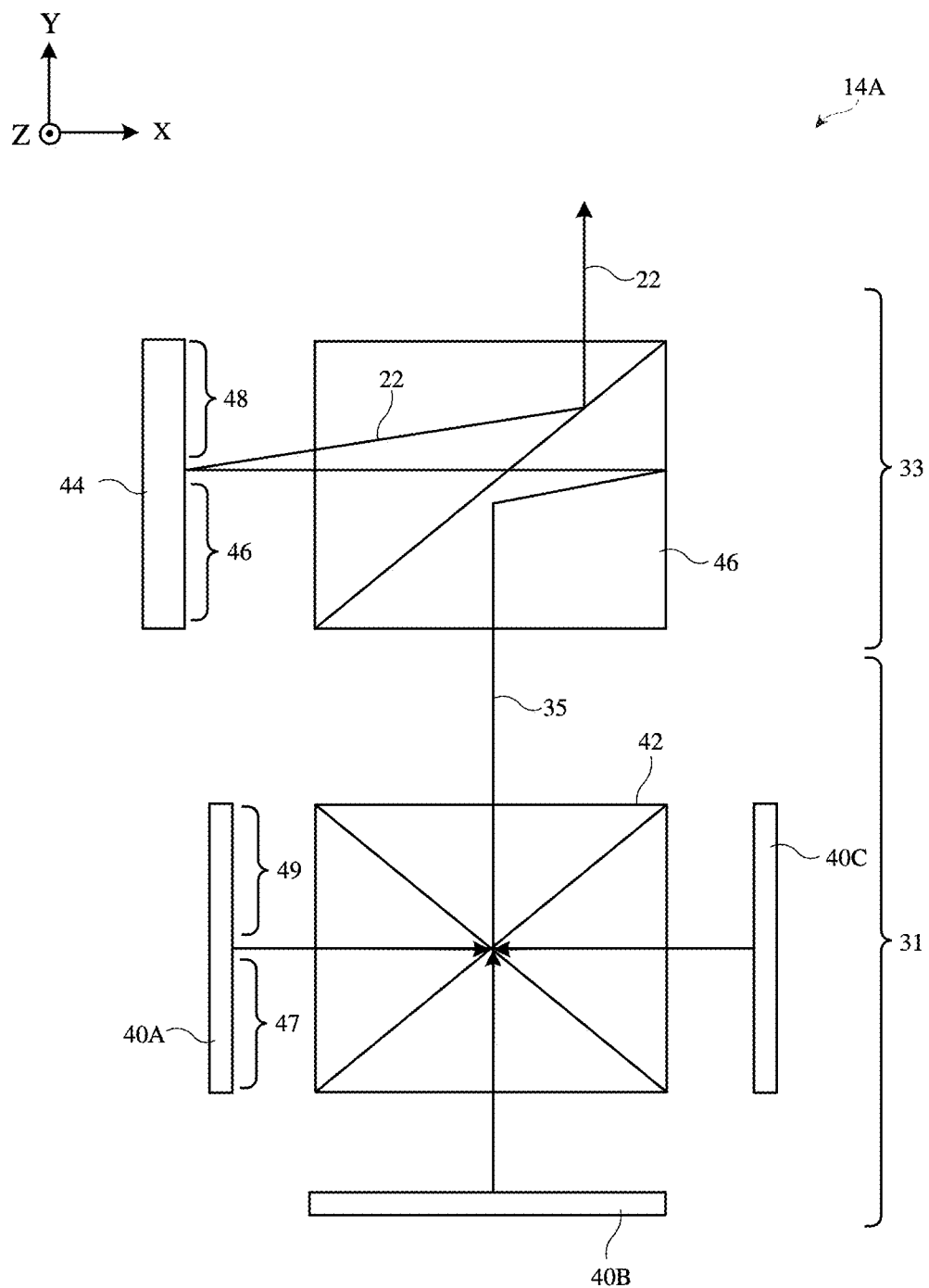
FIG. 3 is a top view of an illustrative display module having an illumination engine and a reflective display panel in accordance with some embodiments.

FIG. 3 is a top view of display module 14A in an example where spatial light modulator 33 is a reflective spatial light modulator. As shown in FIG. 3, illumination engine 31 may include light sources arranged in one or more arrays 40 (sometimes referred to herein as arrays of light sources 40) such as a first array 40A, a second array 40B, and a third array 40C. The light sources in arrays 40 may include any desired light sources (emitters). An example in which the light sources in arrays 40 are light-emitting diodes (LEDs) is described herein as an example. The LEDs may, if desired, include OLEDs, uLEDs, mini LEDs, and/or any other desired light emitting diodes.

Arrays 40A, 40B, and 40C may each emit illumination light 35 of a corresponding wavelength range (e.g., color). For example, array 40A may emit red light, array 40B may emit green light, and array 40C may emit blue light. Prism 42 may combine the light emitted by arrays 40A, 40B, and 40C into illumination light 35 (e.g., illumination light 35 may include red, green, and blue light, etc.) and may provide illumination light 35 to spatial light modulator 33. Lenses or other optical components may be interposed between arrays 40A, 40B, and/or 40C and prism 42 and/or between prism 42 and spatial light modulator 33.

Spatial light modulator 33 may include prism 46 and a reflective display panel such as display panel 44. Display panel 44 may include a DMD panel, an LCOS panel, or other reflective display panel. Prism 46 may direct illumination light 35 to display panel 44 (e.g., to different pixels on display panel 44). Control circuitry 16 (FIG. 1) controls display panel 44 to selectively reflect illumination light 35 at each pixel location to produce image light 22 (e.g., image light having an image as modulated onto the illumination light by display panel 44). Prism 46 may direct image light 22 to collimating optics 34 of FIG. 2. The example of FIG. 3 is merely illustrative. Illumination engine 31 may include any desired light sources arranged in any desired manner for providing illumination light 35 of any desired wavelengths to spatial light modulator 33. Illumination engine 31 may only include one or two of arrays 40A, 40B, and 40C or more than three arrays 40 if desired.

If desired, the light sources (e.g., LEDs) in arrays 40A, 40B, and 40C may be independently adjusted (e.g., by control circuitry 16 of FIG. 1) to adjust the spatial distribution of illumination light 35 on reflective display panel 44. For example, each array may have at least a first set of one or more light sources 49 and a second set of one or more light sources 47 (e.g., sets of LEDs). Control circuitry 16 may independently control the intensity, the emission duration, and/or duty cycles of light sources 49 and 47 to control the brightness of illumination light 35 at different regions of reflective display panel 44. For example, control circuitry 16 may independently control the intensity of light sources 49 to control the amount of illumination light 35 provided to the pixels in region 48 of reflective display panel 44. Similarly, control circuitry 16 may independently control the intensity, the emission duration, and/or duty cycles of light sources 47 to control the amount of illumination light 35 provided to the pixels in region 46 of reflective display panel 44. In this way, the brightness of different regions in the images of image light 22 may be independently controlled. For example, when a bright object is located within region 48, the control circuitry may increase the intensity of light sources 49 without also increasing the intensity of light sources 47. This may, for example, conserve power in display module 14A and provide a high quality image with enhanced dynamic range and contrast with locally-dimmed regions.

The example of FIG. 3 in which each array has two independently controllable sets of light sources 47 and 49 is merely illustrative. In general, each array may have any desired number of independently controllable light sources (e.g., every light source in each array may be independently controlled). Arrays 40A, 40B, and 40C may be independently controlled (e.g., in addition to independently controlling different light sources within the arrays). In this way, display module 14A may perform local dimming of illumination light 35 and thus the images in image light 22 for any desired number of regions in the image, for regions of any desired size (e.g., for regions as small as one pixel), and in any desired color channels. This flexibility may serve to optimize the appearance of the images in image light 22 regardless of the contents of the images, while also optimizing consumption of resources in display module 14A, for example.

In one suitable arrangement that is described herein as an example, arrays 40A, 40B, and 40C are monolithic arrays of light sources in which the light sources in each array are all formed on the same dielectric substrate layer (carrier). Arrays 40A, 40B, and 40C may therefore sometimes be referred to herein as monolithic arrays.

Figure 4:
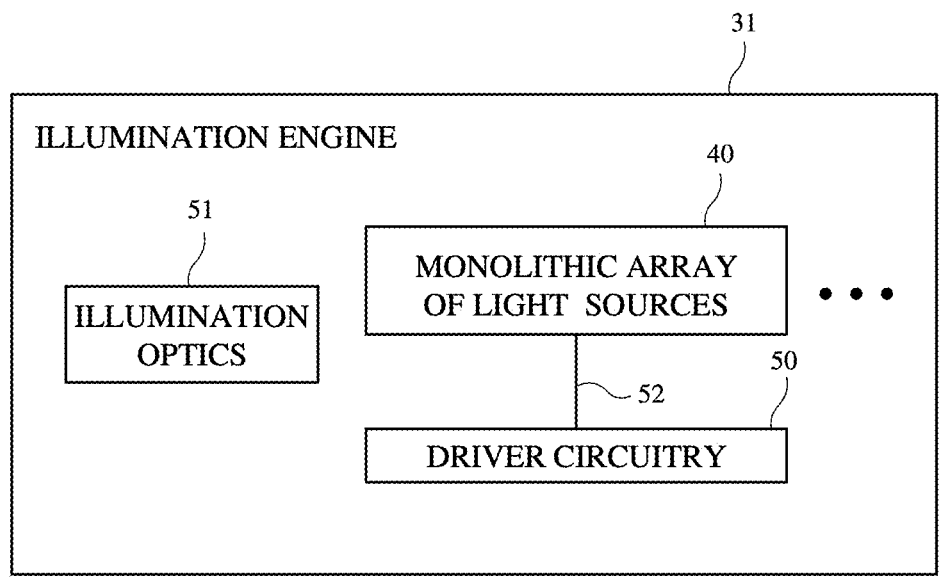
FIG. 4 is a diagram of an illustrative illumination engine having monolithic arrays of independently controlled light sources and corresponding driver circuitry in accordance with some embodiments.

As shown in FIG. 4, illumination engine 31 may include one or more monolithic arrays 40. Monolithic array 40 of FIG. 4 may, for example, be used to form array 40A, array 40B, and/or array 40C of FIG. 3. The light sources (e.g., LEDs) in each monolithic array 40 may all be formed (e.g., patterned) onto the same dielectric substrate layer. The light sources in monolithic array 40 may be driven by display driver circuitry 50. Driver circuitry 50 may, for example, produce drive signals and power supply signals that are provided to the light sources in monolithic array 40 over conductive interconnect structures (paths) 52. The drive signals may be used to independently control each of the LEDs (or sets of the LEDs) in monolithic array 40. The same driver circuitry 50 may be used to drive each monolithic array 40 in illumination engine 31 or each monolithic array 40 in illumination engine 31 may be driven by respective driver circuitry 50. Driver circuitry 50 may be formed on a driver integrated circuit (chip) or on a driver printed circuit board (PCB), for example. Illumination engine 31 may also include illumination optics 51 (e.g., prism 42 of FIG. 3) that help to direct illumination light from monolithic arrays 40 to spatial light modulator 33.

Figure 5:
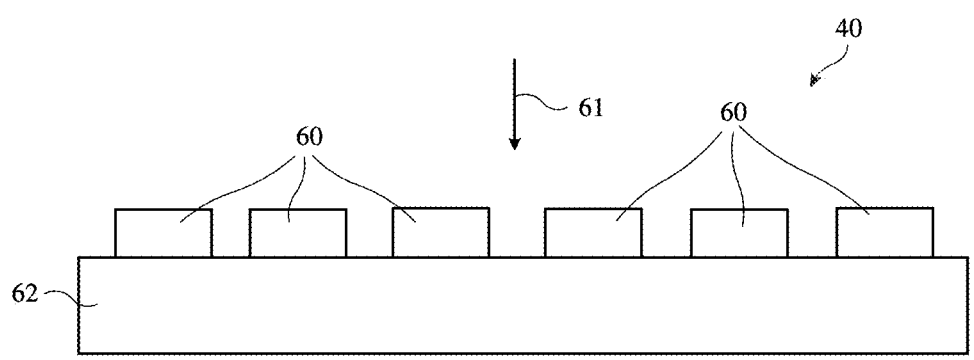
FIG. 5 is a side view of an illustrative monolithic array having light-emitting diodes mounted to the same substrate layer in accordance with some embodiments.

FIG. 5 is a cross-sectional side view of an illustrative monolithic array 40. As shown in FIG. 5, monolithic array 40 may include light sources 60. In one suitable arrangement that is described herein as an example, light sources 60 are LEDs (e.g., OLEDs, uLEDs, mini LEDs, other types of light-emitting diodes, etc.). Light sources 60 may therefore sometimes be referred to herein as LEDs 60. Each LED 60 in monolithic array 40 is mounted to the same surface of a dielectric substrate layer such as dielectric substrate layer 62. Dielectric substrate layer 62 (sometimes referred to herein as substrate 62, substrate layer 62, dielectric substrate 62, layer 62, dielectric layer 62, carrier 62, carrier layer 62, dielectric carrier 62, or dielectric carrier layer 62) may be formed from sapphire, gallium nitride (GaN), silicon, or any other desired semiconductor and dielectric materials. If desired, LEDs 60 may be patterned onto substrate layer 62 at the same time (e.g., prior to bonding monolithic array 40 to conductive interconnect structures 52 of FIG. 4). LEDs 60 may emit light (e.g., illumination light 35 of FIG. 3) through substrate layer 62 (e.g., in the downwards direction of FIG. 5). LEDs 60 may be arranged in a grid of rows and columns or in any other desired pattern on substrate layer 62.

Figure 6:
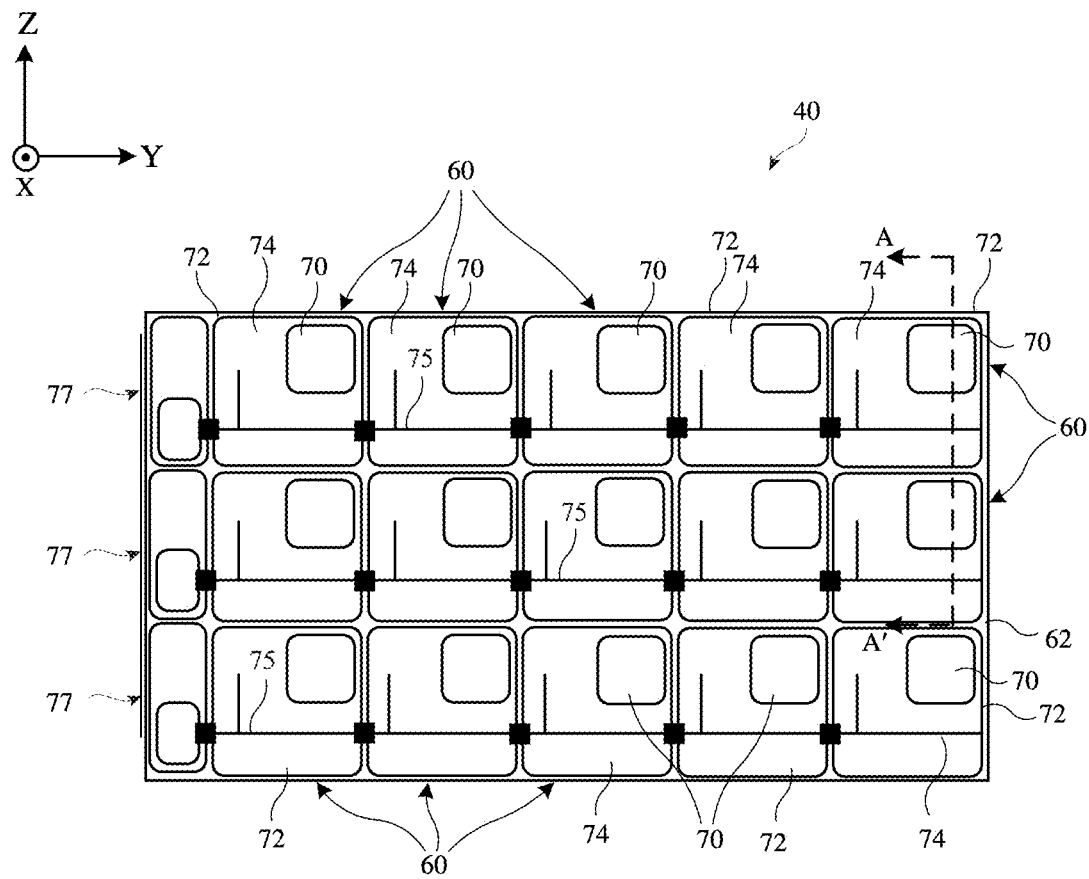
FIG. 6 is a front view of an illustrative monolithic array having rows of light-emitting diodes that share a common anode in accordance with some embodiments.

In one suitable arrangement, each row of LEDs 60 in monolithic array 40 may share a common anode. FIG. 6 is a front view of monolithic array 40 (e.g., as taken in the direction of arrow 61 of FIG. 5) in an example where each row of LEDs 60 in monolithic array 40 share a common anode. As shown in FIG. 6, monolithic array 40 may include a set of LEDs 60 arranged in a grid pattern of rows and columns on substrate layer 62. Each LED 60 includes an n-type semiconductor layer 72 (sometimes referred to herein as n-type layer 72) patterned onto a surface of substrate layer 62, an active p-type semiconductor layer 74 (sometimes referred to herein as p-type layer 74) on n-type layer 72, and a first contact pad 70 (sometimes referred to herein as n contact 70 or n contact pad 70) on p-type layer 74. Paths 76 may couple each LED 60 in a given row of monolithic array 40 to a common (shared) anode 77. Each common anode 77 may form a shared contact pad (e.g., a p contact) for the LEDs 60 in its row of monolithic array 40. N contacts 70 and common anodes 77 may be coupled to electrodes that receive drive signals from driver circuitry 50 of FIG. 4.

Figure 7:
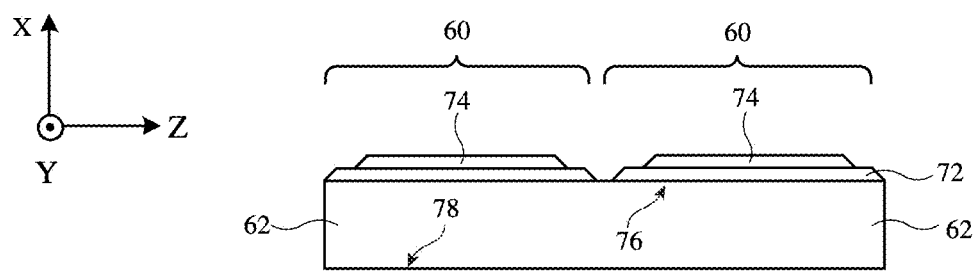
FIG. 7 is a cross-sectional side view of an illustrative monolithic array having rows of light-emitting diodes that share a common anode in accordance with some embodiments.

FIG. 7 is a cross-sectional side view of monolithic array 40 in the example where each row of LEDs 60 in monolithic array 40 shares a common anode 77 (e.g., as taken in the direction of line AA' of FIG. 6). In the example of FIG. 7, n contacts 70 are not shown for the sake of clarity. As shown in FIG. 7, each LED 60 includes an n-type layer 72 patterned on top (upper) surface 76 of substrate layer 62. Substrate layer 62 has a bottom (lower) surface 78 opposite top surface 76. Each LED 60 also includes a p-type layer 74 over n-type layer 72. The lateral area of p-type layer 74 (e.g., in the Y-Z plane of FIG. 7) forms the active area of LED 60 that emits light through substrate layer 62 when driven by corresponding drive signals.

Figure 8:
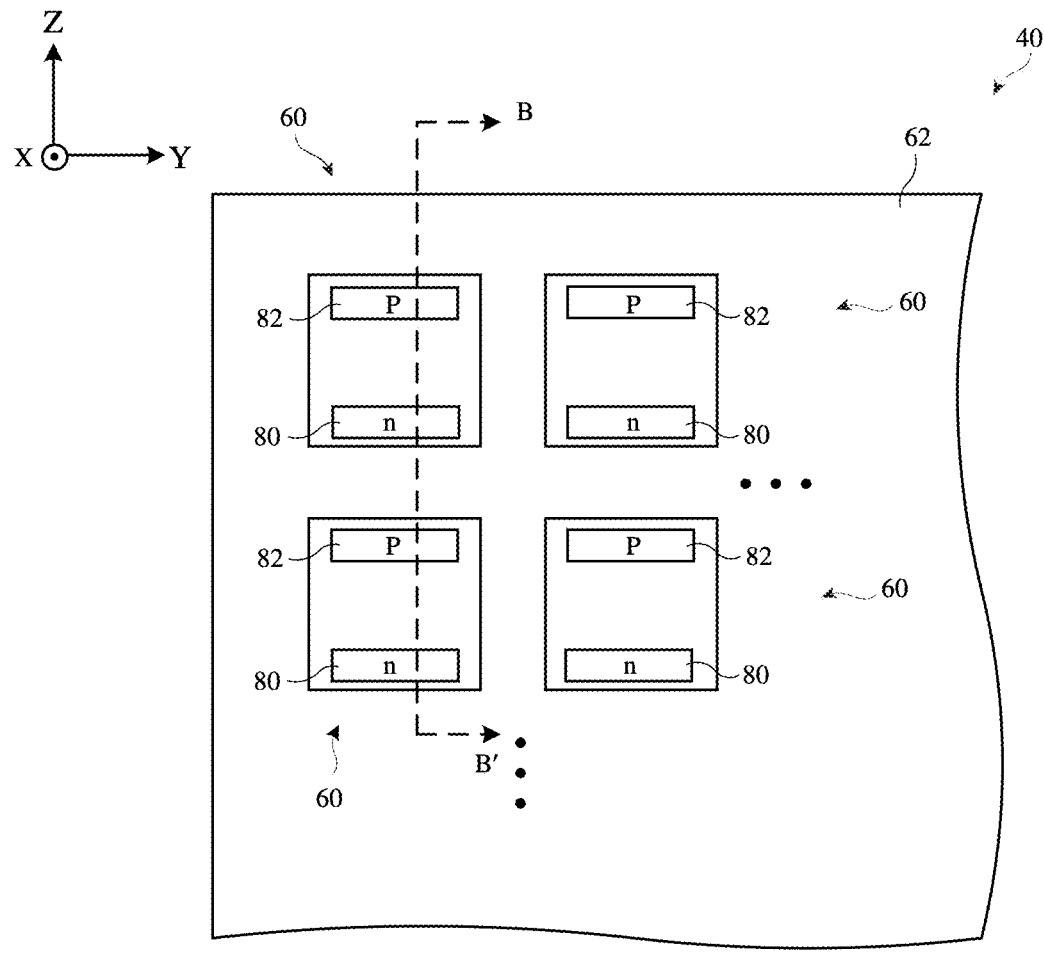
FIG. 8 is a front view of an illustrative monolithic array having light-emitting diodes with respective p and n contacts in accordance with some embodiments.

The example of FIGS. 6 and 7 in which LEDs 60 in each row share a common anode 77 is merely illustrative. In another suitable arrangement, each LED 60 may have a respective pair of contact pads for driving the LEDs. FIG. 8 is a front view of monolithic array 40 (e.g., as taken in the direction of arrow 61 of FIG. 5) in an example where each LED 60 in monolithic array 40 has a respective pair of contact pads. As shown in FIG. 8, each LED 60 in monolithic array 40 may include a respective p contact pad such as p contact 82 and may include a respective n contact pad such as n contact 80. P contacts 82 and n contacts 80 may each be coupled to corresponding electrodes that receive drive signals from driver circuitry 50 of FIG. 4.

Figure 9:
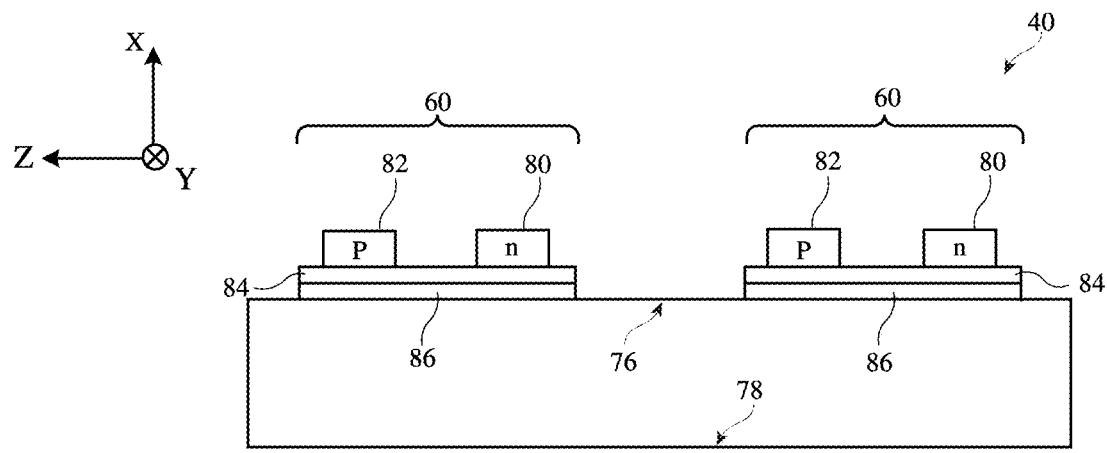
FIG. 9 is a cross-sectional side view of an illustrative monolithic array having light-emitting diodes with respective p and n contacts in accordance with some embodiments.

FIG. 9 is a cross-sectional side view of monolithic array 40 in the example where each LED 60 in monolithic array 40 has a respective pair of contact pads (e.g., as taken in the direction of line BB' of FIG. 8). As shown in FIG. 9, each LED 60 includes an n-type layer 86 patterned on top surface 76 of substrate layer 62. Each LED 60 also includes a p-type layer 84 over n-type layer 86 and a respective p contact 82 and n contact 80 on n-type layer 86. The lateral area of p-type layer 84 (e.g., in the Y-Z plane of FIG. 9) forms the active area of LED 60 that emits light through substrate layer 62 when driven by corresponding drive signals (e.g., as provided over contacts 80 and 82).

Figure 10:
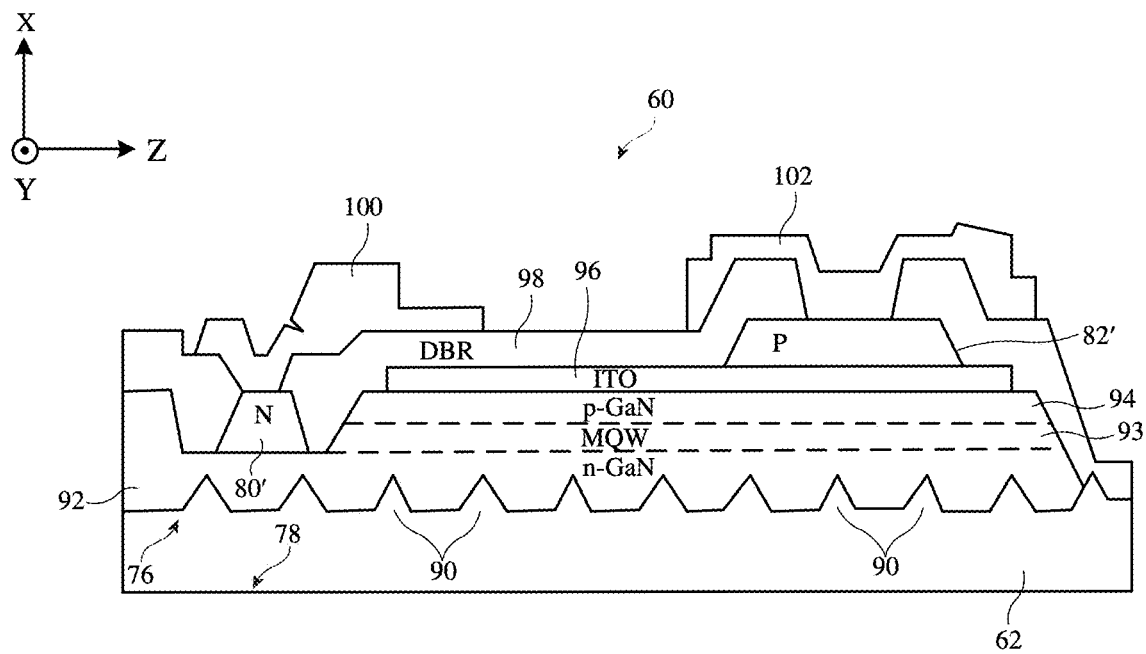
FIG. 10 is a cross-sectional side view of an illustrative light-emitting diode that emits blue or green light for a monolithic array in accordance with some embodiments.

LEDs 60 in monolithic array 40 may be configured to emit any desired wavelength ranges (colors) of light. FIG. 10 is a cross-sectional side view of a given LED 60 in monolithic array 40 in an example where LED 60 is configured to emit blue or green light. LED 60 of FIG. 10 may have a common anode with each LED in its row of monolithic array 40 (e.g., as shown in FIGS. 6 and 7) or may have its own respective pair of p and n contacts (e.g., as shown in FIGS. 8 and 9).

As shown in FIG. 10, LED 60 may be patterned onto top surface 76 of substrate layer 62 (e.g., each LED 60 in monolithic array 40 may be patterned onto top surface 76 of substrate layer 62). LED 60 may include an n-type layer 92 (e.g., an n-type doped GaN layer) on top surface 76 of substrate layer 62. N-type layer 92 may be grown onto substrate layer 62 without the need for a separate bonding layer. Top surface 76 of substrate layer 62 may include textured structures such as structures 90 to help bond n-type layer 92 to substrate layer 62.

LED 60 may include p-type layer 94 (e.g., a p-type doped GaN layer) over n-type layer 92. Multi-quantum wells (MQW) such as MQW 93 may be placed at the interface between p-type layer 94 and n-type layer 92. MQW 93 forms the active light emitting area of LED 60 and emits light through substrate layer 62. LED 60 may also include a transparent electrode layer such as indium tin oxide (ITO) layer 96 (sometimes referred to herein as ITO traces 96). ITO layer 96 may serve to spread current across the lateral area of LED 60. LED 60 may have a p contact pad such as p contact 82' on ITO layer 96 and may have an n contact pad such as n contact 80' on n-type layer 92. Contacts 80' and 82' may, for example, be formed from metal. If desired, a distributed Bragg reflector (DBR) 98 may be layered over n-type layer 92, contacts 80' and 82', p-type layer 94, and ITO layer 96. DBR 98 may serve as a diffractive mirror that helps to redirect any light emitted by MQW 93 in the upward direction (e.g., in the +X direction) back down through substrate layer 62 (e.g., in the −X direction). An n fanout pad such as fanout pad 100 may be placed in contact with n contact 80' over DBR 98. A p fanout pad such as fanout pad 102 may be placed in contact with p contact 82' over DBR 98. Fanout pads 100 and 102 may be coupled to electrodes that convey the drive signals for LED 60.

Figure 11:
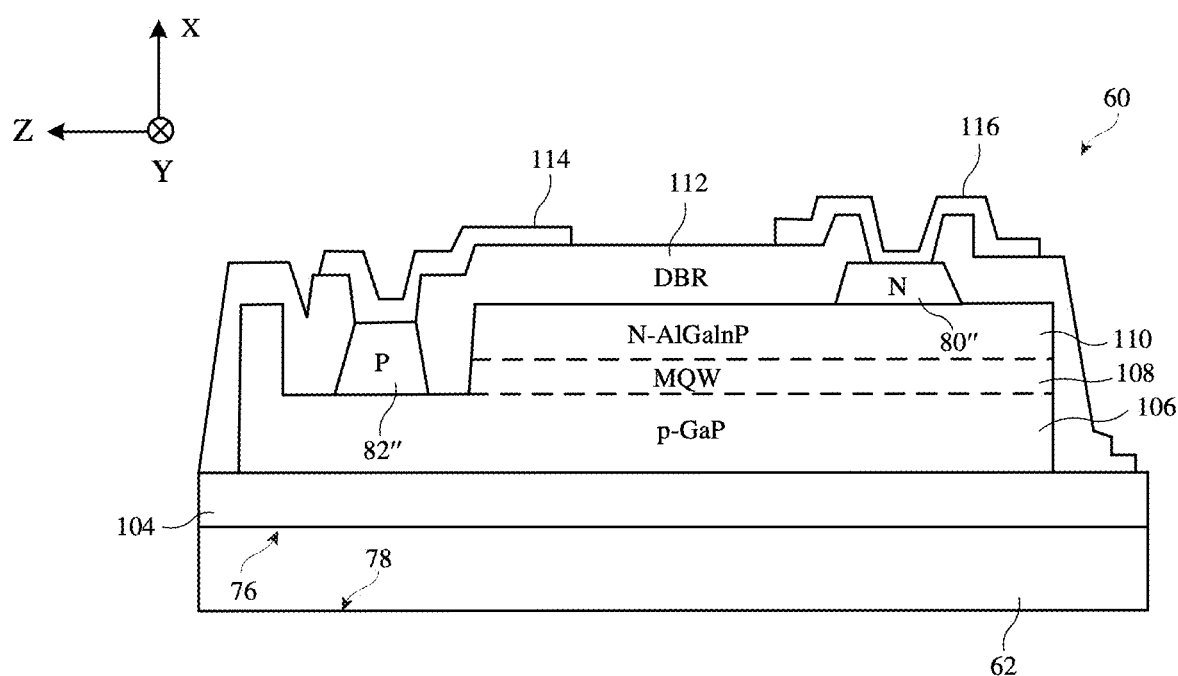
FIG. 11 is a cross-sectional side view of an illustrative light-emitting diode that emits red light for a monolithic array in accordance with some embodiments.

FIG. 11 is a cross-sectional side view of a given LED 60 in monolithic array 40 in an example where LED 60 is configured to emit red light. LED 60 of FIG. 11 may have a common anode with each of the LEDs in its row of monolithic array 40 (e.g., as shown in FIGS. 6 and 7) or may have its own respective pair of p and n contacts (e.g., as shown in FIGS. 8 and 9).

As shown in FIG. 11, LED 60 may include a p-type layer 106 (e.g., a p-type doped Gallium Phosphide (GaP) layer) patterned onto top surface 76 of substrate layer 62. A bonding layer such as bonding layer 104 may be used to help bond p-type layer 106 to substrate layer 62 (e.g., GaP may not be lattice-matched to substrate layer 62 in scenarios where substrate layer 62 is formed from sapphire). LED 60 may also include n-type layer 110 (e.g., an n-type doped aluminum gallium indium phosphide (AlGaInP) layer) over p-type layer 106. Multi-quantum wells such as MQW 108 may be placed at the interface between p-type layer 106 and n-type layer 110. MQW 108 forms the active light emitting area of LED 60 and emits light through substrate layer 62.

LED 60 may also include a p contact pad such as p contact 82" on p-type layer 106 and an n contact pad such as n contact 80" on n-type layer 92. Contacts 80" and 82" may, for example, be formed from metal. If desired, a distributed DBR 112 may be layered over LED 60. An n fanout pad such as fanout pad 116 may be placed in contact with n contact 80" over DBR 112. A p fanout pad such as fanout pad 114 may be placed in contact with p contact 82" over DBR 112. Fanout pads 114 and 116 may be coupled to electrodes that convey the drive signals for LED 60.

Figure 12:
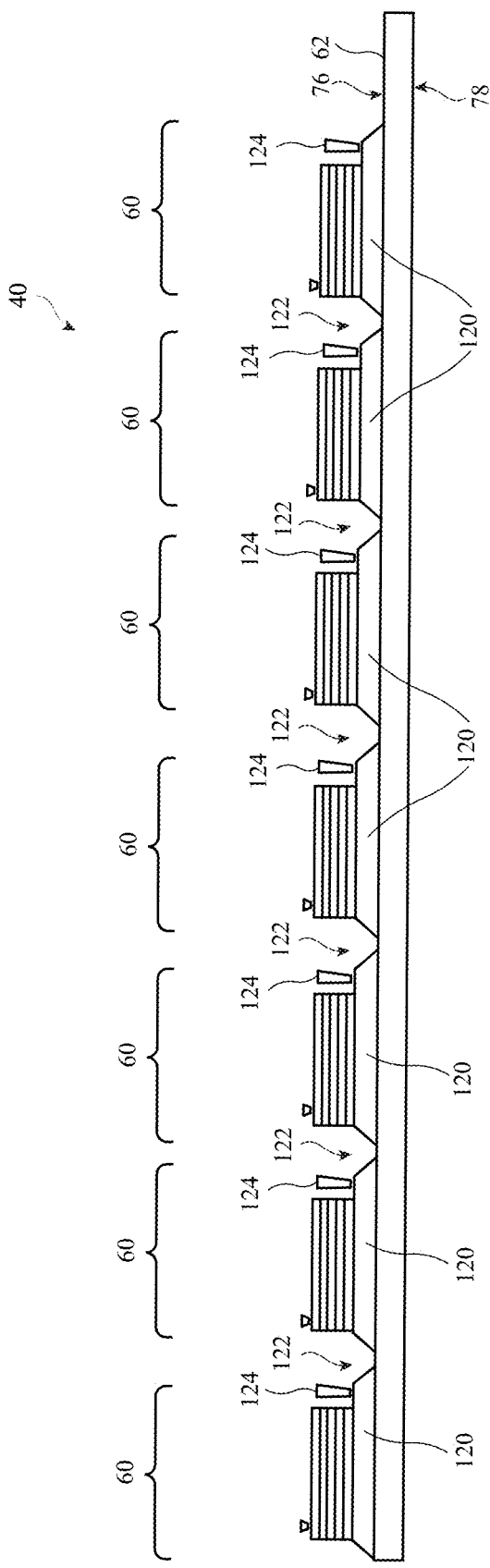
FIG. 12 is a cross-sectional side view of an illustrative monolithic array of light sources having separate n contacts in accordance with some embodiments.

In one suitable arrangement, each LED 60 in monolithic array 40 may have a separate respective n contact (e.g., n contacts 80' and 80" of FIGS. 10 and 11). FIG. 12 is a cross-sectional side view showing how each LED 60 in monolithic array 40 may have a separate respective n contact. As shown in FIG. 12, LEDs 60 are formed on top surface 76 of substrate layer 62. Each LED 60 has a respective n-type layer such as n-type layer 120 (e.g., n-type layer 92 of FIG. 10). Each n-type layer 120 is coupled to a respective electrode 124 (e.g., an electrode and corresponding contact pad such as contact pad 80' of FIG. 10) that receives drive signals from the drive circuitry. The n-type layer 120 in each LED 60 is separated from the n-type layer 120 in the adjacent LEDs 60 by a corresponding gap 122.

Figure 13:
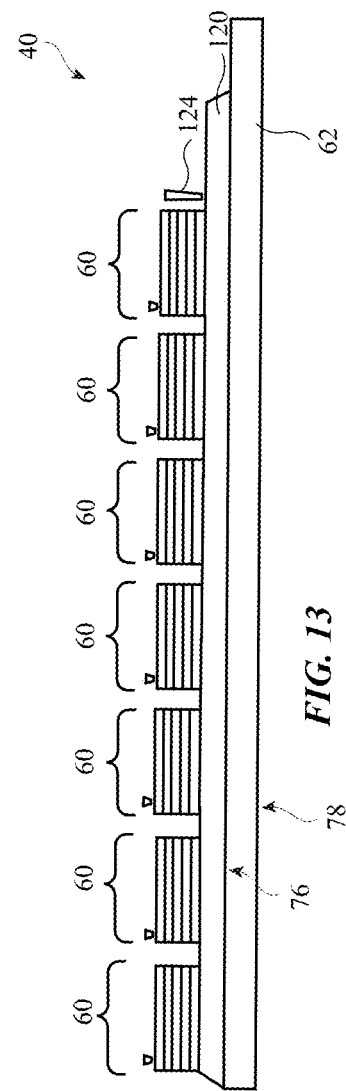
FIG. 13 is a cross-sectional side view of an illustrative monolithic array of light sources that share a common n contact in accordance with some embodiments.

In another suitable arrangement, each LED in monolithic array 40 may share a common n contact. FIG. 13 is a cross-sectional side view showing how each LED in monolithic array 40 may share a common n contact. As shown in FIG. 13, LEDs 60 are formed on top surface 76 of substrate layer 62. Each LED 60 is formed over a respective portion of the same n-type layer 120 (e.g., n-type layer 92 of FIG. 10 may be shared by each LED 60 in the array). In this way, gaps 122 of FIG. 12 may be omitted. Electrode 124 on n-type layer 120 may be shared by each of the LEDs 60 on n-type layer 120. Sharing n-type layer 120 as shown in FIG. 13 may enable higher active area fill factor. However, forming respective n contacts, as shown in FIG. 12, may exhibit superior current spreading (e.g., IR drop) than sharing n-type layer 120.

In general, it is desirable to direct as much of the light emitted by each LED 60 through substrate layer 62 with as much brightness uniformity as possible (e.g., to form illumination light 35 of FIG. 3). If care is not taken, light emitted by LEDs 60 through substrate layer 62 may be subject to undesirable cross talk and power leakage that reduces the brightness and uniformity of the illumination light 35. In some scenarios, a diffuser may be used to help optimize brightness uniformity for LEDs 60. However, diffusers may introduce undesirable loss to the light emitted by LEDs 60. It may therefore be desirable to provide monolithic array 40 with light redirecting structures for optimizing optical performance of LEDs 60.

Figure 14:
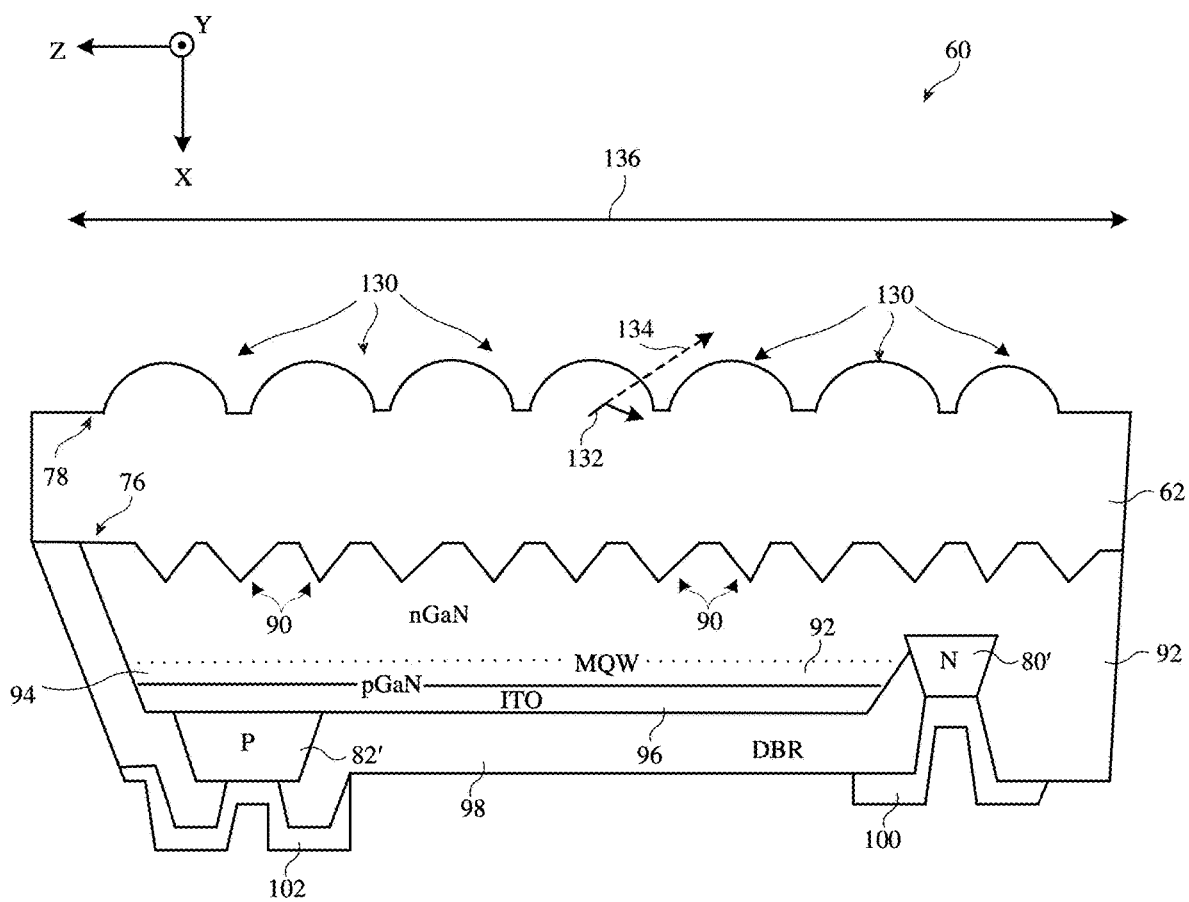
FIGS. 14-19 are cross-sectional side views showing how an illustrative monolithic array of light sources may include different light redirecting structures for optimizing optical performance in accordance with some embodiments.

FIGS. 14-19 are cross-sectional side views of illustrative light redirecting structures that may be provided on monolithic array 40 for optimizing the optical performance of LEDs 60. FIG. 14 is a diagram of an illustrative LED 60 in monolithic array 40 in an example where substrate layer 102 has a textured surface to help redirect emitted light.

As shown in FIG. 14, LED 60 may be mounted to surface 76 of substrate layer 62. In the example of FIG. 14, LED 60 is configured to emit blue or green light (e.g., using the stack up of FIG. 10). This is merely illustrative and, in general, LED 60 may be provided with the stack up of FIG. 11 (e.g., for emitting red light) or any other desired stack up for emitting light of any desired colors. LED 60 of FIG. 14 may share its n contact with other LEDs in monolithic array 40 (e.g., as shown in the examples of FIGS. 6, 7, and 13) or may have its own respective n contact (e.g., as shown in the examples of FIGS. 8, 9, and 12).

As shown in FIG. 14, surface 78 of substrate layer 62 may be patterned or textured (e.g., etched) to include surface features 130 (sometimes referred to herein as light redirecting elements 130). Light redirecting elements 130 may be spherical, aspherical, curved, or any other desired shape. Light redirecting elements 130 may, for example, form an array of microlenses in surface 78 of substrate layer 62 and overlapping the active area of LED 60. In the absence of light redirecting elements 130, some of the light emitted by LED 60 may propagate laterally along substrate layer 62 via total internal reflection, as shown by arrow 132. This light may produce undesirable cross talk and signal leakage out of the side of substrate layer 62. The presence of light redirecting elements 130 may serve to break up the total internal reflection mode of substrate layer 62, allowing the light that would otherwise propagate laterally along substrate layer 62 to instead be redirected as useful power through surface 78, as shown by arrow 134. This may serve to prevent the light from propagating via total internal reflection along substrate layer 62, thus mitigating cross talk and signal leakage (which can otherwise lead to reduced contrast between display pixels) and optimizing the point spread function uniformity (e.g., brightness uniformity) of LED 60 (e.g., LED 60 may emit uniform useful power across lateral area 136 of FIG. 14).

Figure 15:
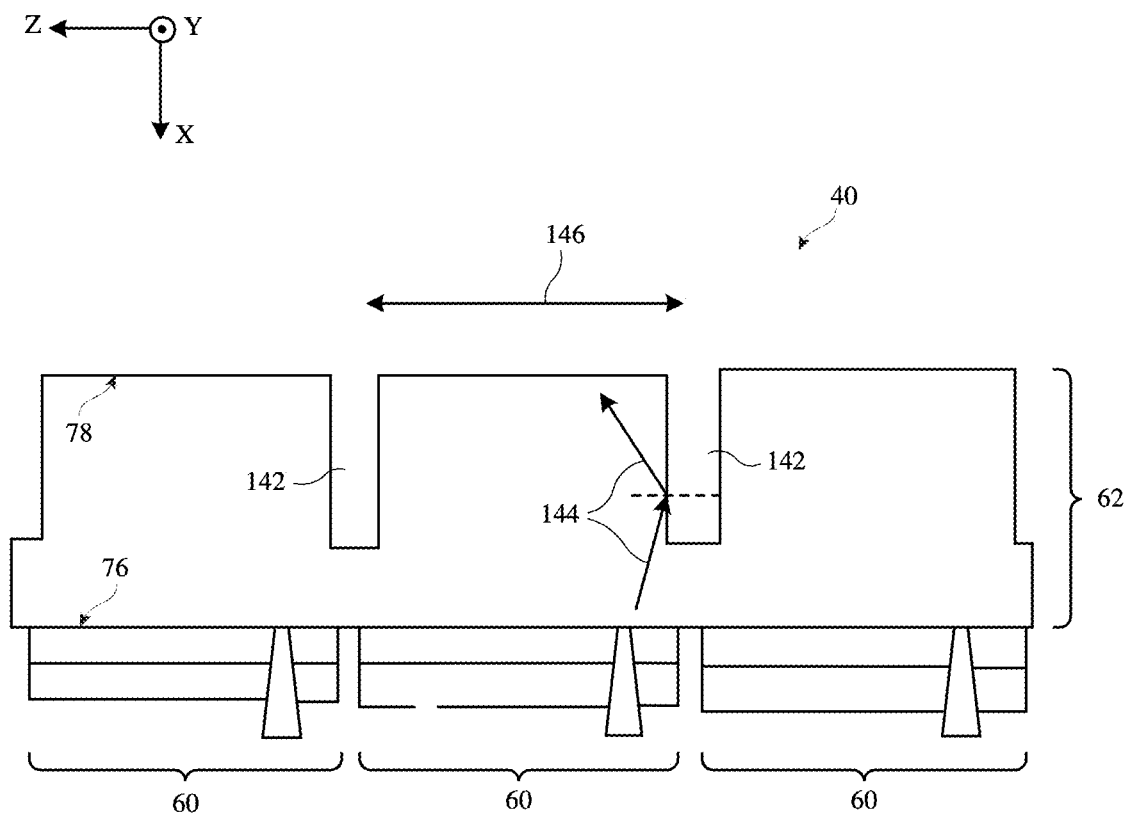

FIG. 15 is a diagram of monolithic array 40 in an example where substrate layer 62 includes trenches between adjacent LEDs 60 to help redirect emitted light in a desired direction. As shown in FIG. 15, monolithic array 40 may include LEDs 60 mounted to surface 76 of substrate layer 62. LEDs 60 may be configured to emit blue or green light (e.g., using the stack up of FIG. 10), may be configured to emit red light (e.g., using the stack up of FIG. 11), may be configured to emit light of other colors (e.g., may be formed using any desired stack up), may share an n contact with the other LEDs in monolithic array 40 (e.g., as shown in the examples of FIGS. 6, 7, and 13), or may have respective n contacts (e.g., as shown in the examples of FIGS. 8, 9, and 12).

As shown in FIG. 15, trenches 142 may be cut into surface 78 of substrate layer 62 between adjacent LEDs 60. Trenches 142 may, for example, laterally surround the lateral outline (footprint) of a corresponding LED 60 in substrate layer 62 (e.g., when viewed in the Z-Y plane). Trenches 142 may extend through some but not all of the thickness of substrate layer 62 (e.g., in the X direction). In another possible arrangement, trenches 142 may extend through all of the thickness of substrate layer 62. Trenches 142 need not have a rectangular profile and may, in general, have any desired shape. Trenches 142 may redirect some of the light emitted by LEDs 60 in a desired direction (e.g., as shown by arrows 144). In this way, trenches 142 may help to collimate the beams of light emitted by LEDs 60 and to increase transmitted power (e.g., each LED 60 may emit uniform useful power across a corresponding lateral area 146). Trenches 142 may be filled with air or other materials if desired.

Figure 16:
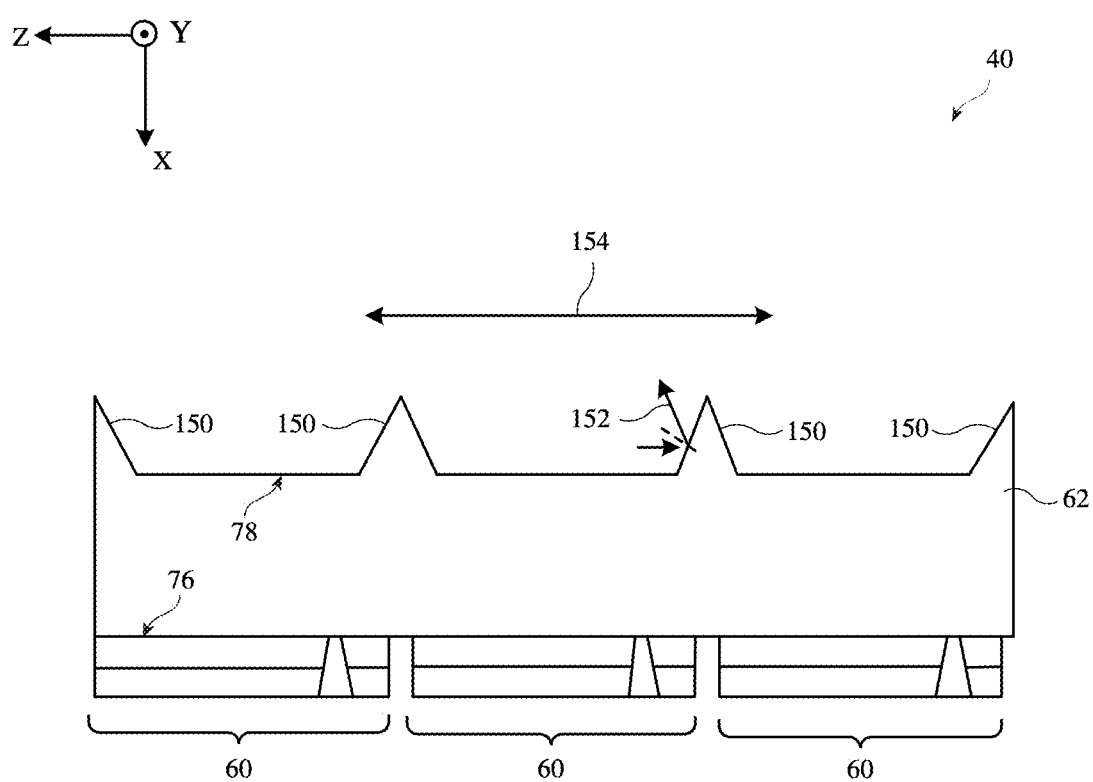

FIG. 16 is a diagram of monolithic array 40 in an example where substrate layer 62 includes protruding structures between adjacent LEDs 60 to help redirect emitted light in a desired direction. As shown in FIG. 16, monolithic array 40 may include LEDs 60 mounted to surface 76 of substrate layer 62. LEDs 60 may be configured to emit blue or green light (e.g., using the stack up of FIG. 10), may be configured to emit red light (e.g., using the stack up of FIG. 11), may be configured to emit light of other colors (e.g., may be formed using any desired stack up), may share an n contact with the other LEDs in monolithic array 40 (e.g., as shown in the examples of FIGS. 6, 7, and 13), or may have separate respective n contacts (e.g., as shown in the examples of FIGS. 8, 9, and 12).

As shown in FIG. 16, protrusions such as protruding structures 150 may protrude above the plane of surface 78 of substrate layer 62 between adjacent LEDs 60. Protruding structures 150 may, for example, be formed by removing the portion of substrate layer 62 between protruding structures 150 (e.g., material overlapping the active areas of LEDs 60). Protruding structures 150 may, for example, laterally surround the lateral outline (footprint) of a corresponding LED 60 in substrate layer 62 (e.g., when viewed in the Z-Y plane). Protruding structures 150 may be triangular, trapezoidal, curved, or any other desired shapes. The sidewalls of protruding structures 150 may extend at an angle parallel to the normal axis of surface 76 (e.g., parallel to the X axis) or at a non-zero angle with respect to the normal axis (e.g., as shown in FIG. 16). Protruding structures 150 may redirect some of the light emitted by LEDs 60 in a desired direction (e.g., as shown by arrows 152). In this way, protruding structures 150 may help to collimate the beams of light emitted by LEDs 60 while helping to confine the rays emitted by each LED within a desired area (e.g., each LED 60 may emit uniform useful power across a corresponding lateral area 154).

Figure 17:
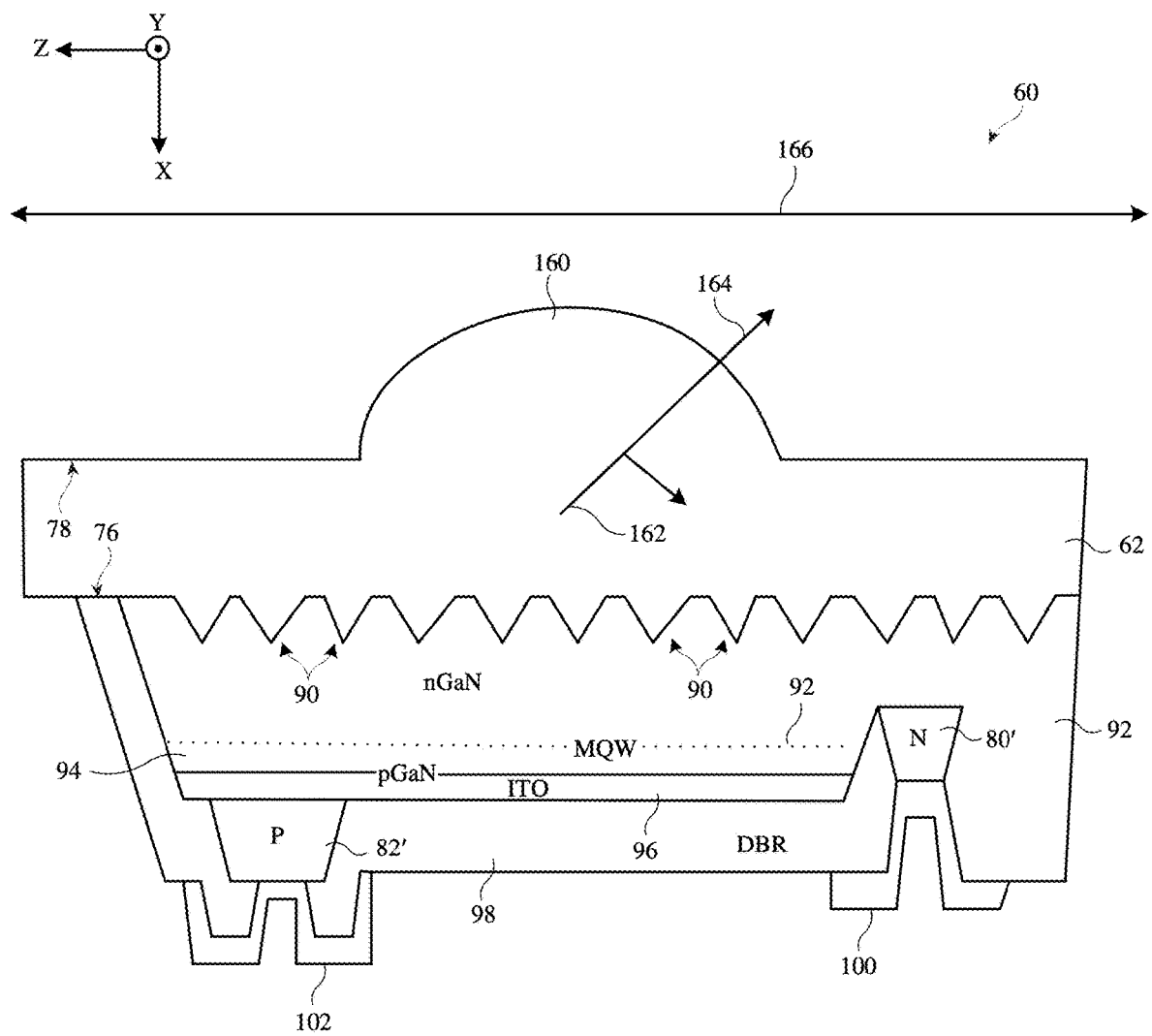

FIG. 17 is a diagram of an illustrative LED 60 in monolithic array 40 in an example where surface 78 of substrate layer 62 is patterned to form a lens element for the LED. As shown in FIG. 17, LED 60 may be mounted to surface 76 of substrate layer 62. In the example of FIG. 17, LED 60 is configured to emit blue or green light (e.g., using the stack up of FIG. 10). This is merely illustrative and, in general, LED 60 may be provided with the stack up of FIG. 11 (e.g., for emitting red light) or any other desired stack up for emitting light of any desired colors. LED 60 of FIG. 16 may share its n contact with other LEDs in monolithic array 40 (e.g., as shown in the examples of FIGS. 6, 7, and 13) or may have its own a separate n contact (e.g., as shown in the examples of FIGS. 8, 9, and 12).

As shown in FIG. 17, surface 78 of substrate layer 62 may be patterned or textured (e.g., etched) to include surface feature 160 (sometimes referred to herein as light redirecting structure 160). Light redirecting structure 160 may, for example, form a lens element. Light redirecting structure 160 may therefore sometimes be referred to herein as lens element 160. Lens element 160 may be spherical, aspherical, curved, or any other desired shape. Lens element 160 may overlap the active area of LED 60. In the absence of lens element 160, some of the light emitted by LED 60 may propagate laterally along substrate layer 62 via total internal reflection, as shown by arrow 162. This light may produce undesirable cross talk and signal leakage out of the side of substrate layer 62. The presence of lens element 160 may serve to break up the total internal reflection mode of substrate layer 62, allowing the light that would otherwise propagate laterally along substrate layer 62 to instead be redirected as useful power through surface 78, as shown by arrow 164. At the same time, lens element 160 may serve to focus the emitted light in a desired direction. This may serve to prevent the light from propagating via total internal reflection along substrate layer 62, thus mitigating cross talk and signal leakage (which can otherwise lead to reduced contrast between display pixels), while also optimizing the point spread function uniformity (e.g., brightness uniformity) and intensity of LED 60 (e.g., LED 60 may emit uniform useful power across lateral area 166 of FIG. 17).

Figure 18:
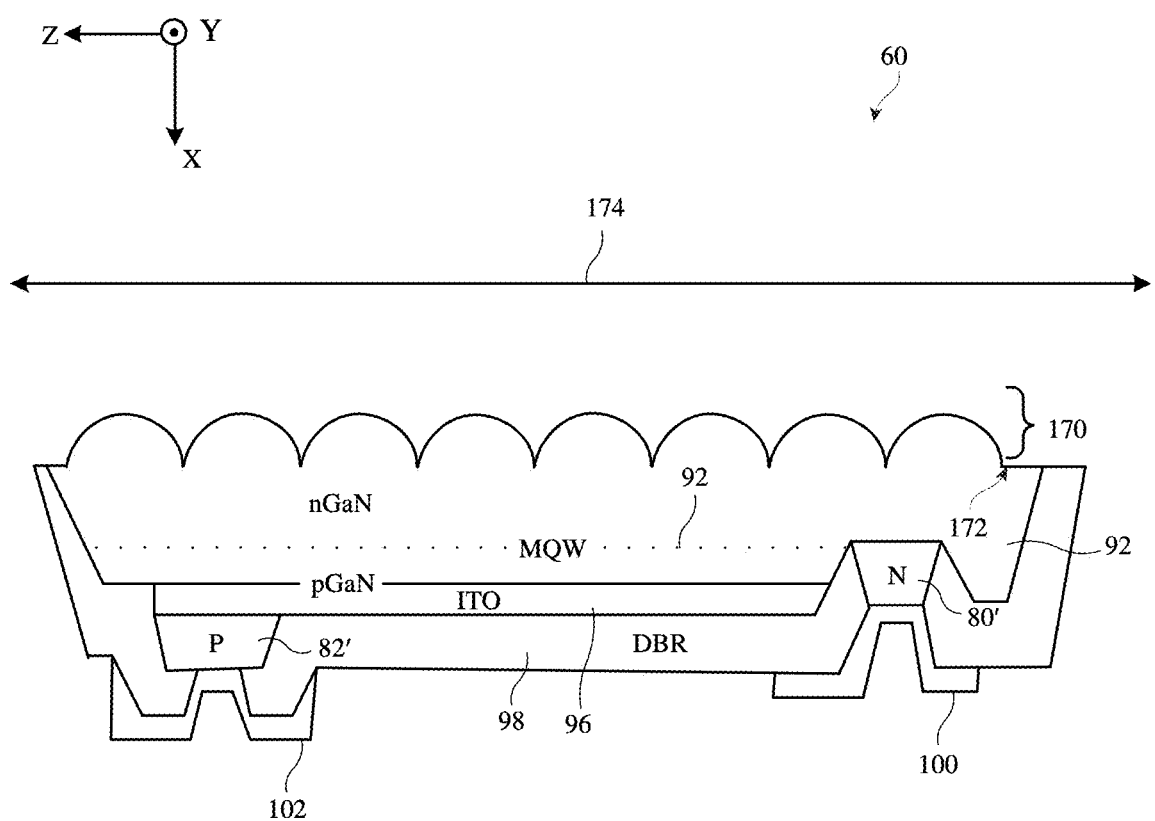

FIG. 18 is a diagram of an illustrative LED 60 in monolithic array 40 in an example where substrate layer 62 is omitted and n-type layer 92 has a textured surface to help redirect emitted light in a desired direction. In the example of FIG. 18, LED 60 is configured to emit blue or green light (e.g., using the stack up of FIG. 10). This is merely illustrative and, in general, LED 60 may be provided with the stack up of FIG. 11 (e.g., for emitting red light) or any other desired stack up for emitting light of any desired colors. LED 60 of FIG. 17 may share its n contact with other LEDs in monolithic array 40 (e.g., as shown in the examples of FIGS. 6, 7, and 13) or may have its own separate n contact (e.g., as shown in the examples of FIGS. 8, 9, and 12).

As shown in FIG. 18, surface 172 of n-type layer 92 may be patterned or textured (e.g., etched) to include surface features 170 (sometimes referred to herein as light redirecting elements 170). Light redirecting elements 170 may be spherical, aspherical, curved, or any other desired shape. Light redirecting elements 170 may, for example, form an array of microlenses in surface 172 of n-type layer 92 and overlapping the active area of LED 60. Light redirecting elements 170 may serve to increase transmitted power for LED 60 while helping to confine the rays emitted LED 60 within a desired area (e.g., each LED 60 may emit uniform useful power across a corresponding lateral area 174).

Figure 19:
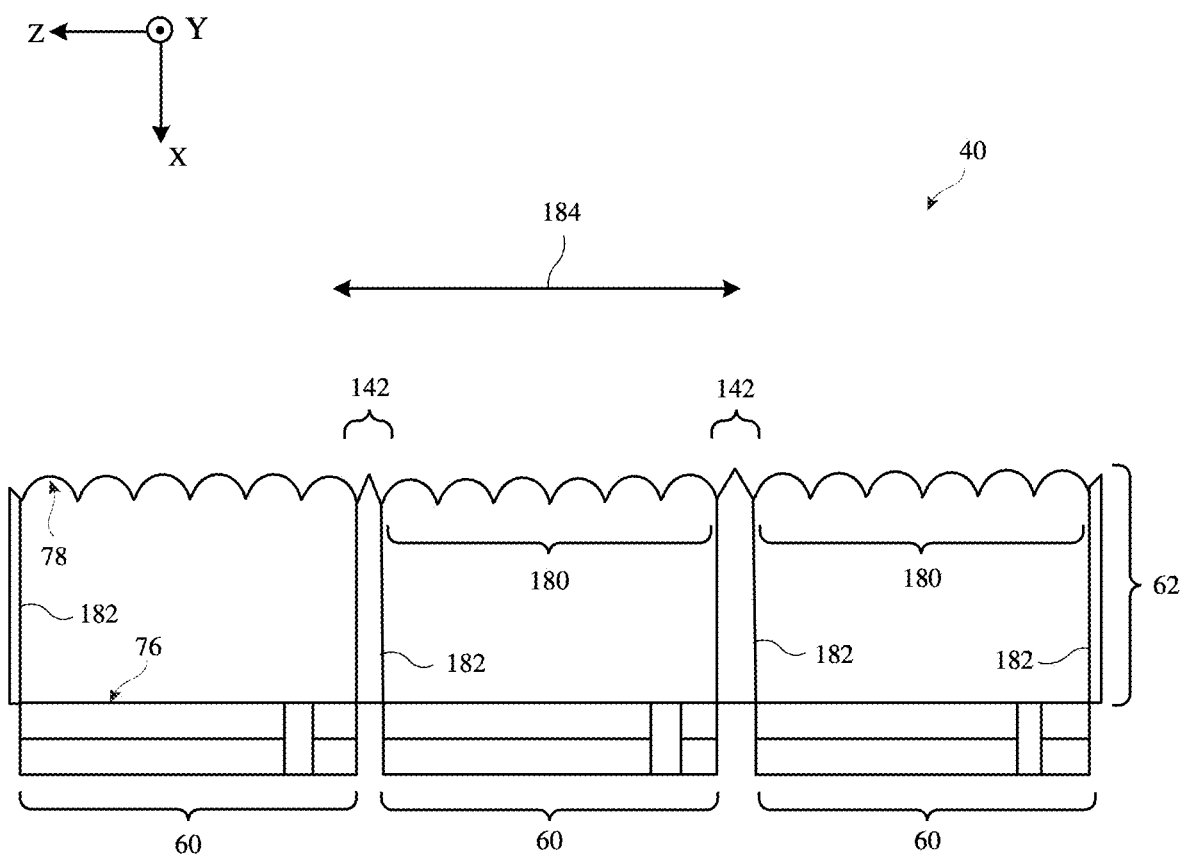

If desired, the arrangements of FIGS. 14-18 may be combined in any desired manner FIG. 19 is a diagram of monolithic array 40 in an example where substrate layer 62 includes trenches between adjacent LEDs 60 and a textured surface to help redirect emitted light in a desired direction. As shown in FIG. 19, monolithic array 40 may include LEDs 60 mounted to surface 76 of substrate layer 62. LEDs 60 may be configured to emit blue or green light (e.g., using the stack up of FIG. 10), may be configured to emit red light (e.g., using the stack up of FIG. 11), may be configured to emit light of other colors (e.g., may be formed using any desired stack up), may share an n contact with the other LEDs in monolithic array 40 (e.g., as shown in the examples of FIGS. 6, 7, and 13), or may have separate respective n contacts (e.g., as shown in the examples of FIGS. 8, 9, and 12).

As shown in FIG. 19, surface 78 of substrate layer 62 may be patterned or textured (e.g., etched) to include surface features 180 (sometimes referred to herein as light redirecting elements 180). Light redirecting elements 180 may be spherical, aspherical, curved, or any other desired shape. Light redirecting elements 180 may, for example, form an array of microlenses in surface 78 of substrate layer 62 and overlapping the active area of LEDs 60 (e.g., respective microlens arrays over each LED in monolithic array 40). At the same time, trenches 142 may be cut into surface 78 of substrate layer 62 between adjacent LEDs 60. Trenches 142 may, for example, laterally surround the lateral outline (footprint) of a corresponding LED 60 in substrate layer 62 (e.g., when viewed in the Z-Y plane). Trenches 142 may extend through some or all of the thickness of substrate layer 62 (e.g., in the X direction). Trenches 142 may be filled with air. In another suitable arrangement, trenches 142 may be filled with material 182. Light redirecting elements 180 and trenches 142 (as well as optional material 182) may help to mitigate cross talk between LEDs 60, may break up total internal reflection modes of substrate layer 62, may mitigate leakage out the side of substrate layer 62, may help to collimate and/or focus (e.g., confine) the light emitted by each LED in a desired direction (e.g., each LED 60 may emit uniform useful power across a corresponding lateral area 184), may help to increase transmitted power (which results in improved light source efficiency and reduces the overall display module power), and/or may help to increase point spread function uniformity of monolithic array 40.

Figure 20:
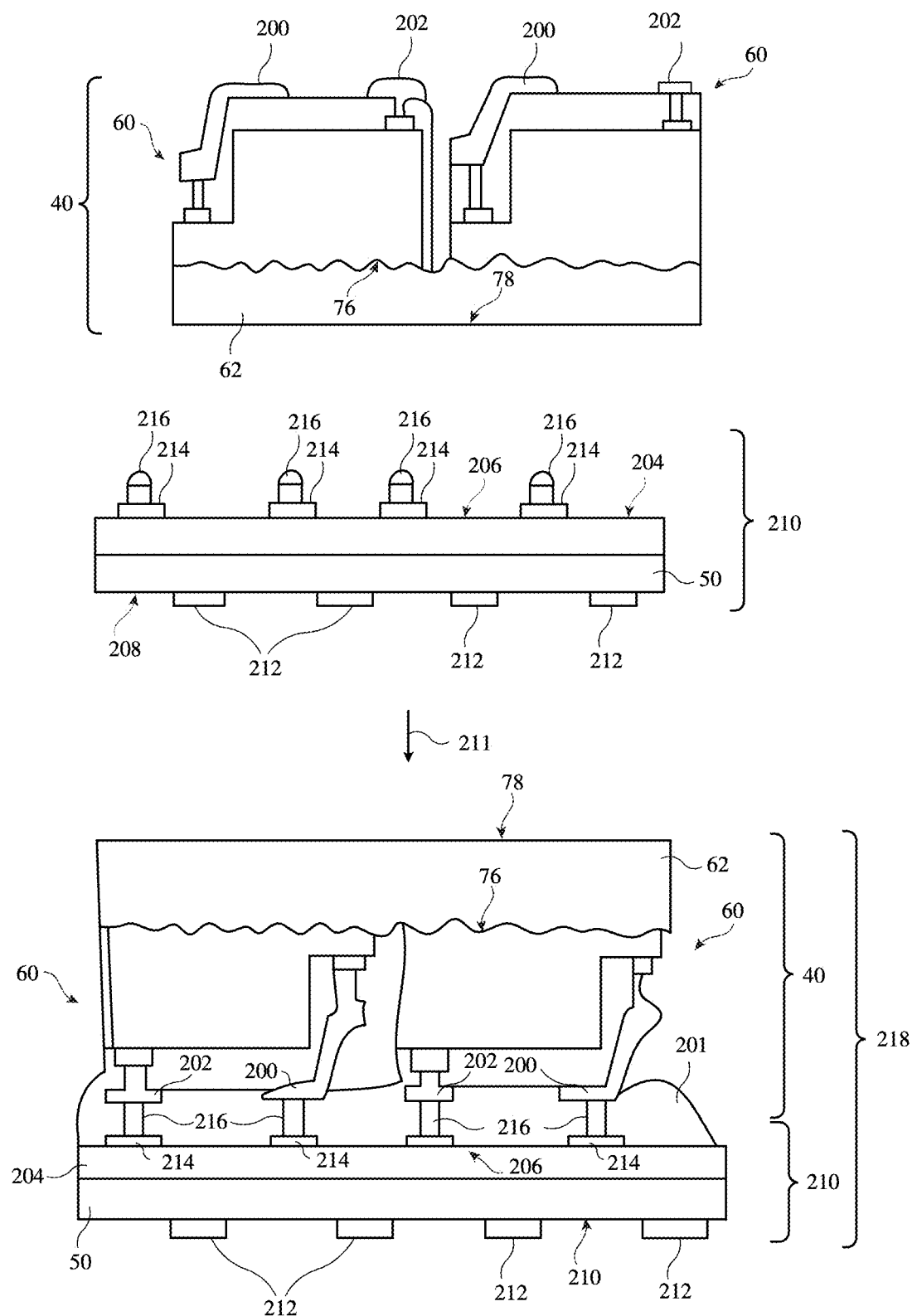
FIG. 20 is a flow diagram showing how an illustrative monolithic array of light sources may be bonded to copper pillars on a driver integrated circuit in accordance with some embodiments.

Monolithic array 40 may be coupled to driver circuitry 50 using conductive interconnect structures 52 of FIG. 4. In one suitable arrangement, driver circuitry 50 may be formed on a driver integrated circuit and monolithic array 40 may be bonded to copper pillars on the driver integrated circuit. FIG. 20 is a flow diagram showing how driver circuitry 50 may be formed on a driver integrated circuit and monolithic array 40 may be bonded to copper pillars on the driver integrated circuit.

As shown in FIG. 20, monolithic array 40 and a substrate such as driver integrated circuit 210 may be provided (e.g., assembled in a manufacturing system using manufacturing equipment). Monolithic array 40 may include LEDs 60 mounted to surface 76 of substrate layer 62. The LEDs 60 may have p contacts 200 and n contacts 202 (e.g., contacts 70, 77, 80, 82, 80', 82', 80", or 82" of FIGS. 6-11, 14, 17, and 18). The example of FIG. 20 only shows two LEDs 60 in monolithic array 40 for the sake of clarity. In general, monolithic array 40 may include any desired number of LEDs 60 grown or otherwise bonded onto substrate layer 62 (e.g., an N-by-M array of LEDs 60).

LEDs 60 may be configured to emit blue or green light (e.g., using the stack up of FIG. 10), may be configured to emit red light (e.g., using the stack up of FIG. 11), may be configured to emit light of other colors (e.g., may be formed using any desired stack up), may share an n contact with the other LEDs in monolithic array 40 (e.g., as shown in the examples of FIGS. 6, 7, and 13), or may have separate respective n contacts (e.g., as shown in the examples of FIGS. 8, 9, and 12). Different LEDs 60 on monolithic array 40 may emit light of different colors if desired. Substrate layer 62 may include light redirecting elements 130 of FIG. 14, trenches 142 (FIG. 15) and optional material 182 (FIG. 19), protruding structures 150 (FIG. 16), and/or lens element 160 (FIG. 17). Different LEDs in monolithic array 40 may include different combinations of these structures if desired. In another suitable arrangement, substrate layer 62 may be omitted and LEDs 60 may include light redirecting elements 170 of FIG. 18 (e.g., bonding to driver integrated circuit 210 may hold each of the LEDs in place in the absence of substrate layer 62).

As shown in FIG. 20, driver integrated circuit 210 (sometimes referred to herein as driver chip 210) may include driver circuitry 50 and metal layer 204. Driver integrated circuit (IC) 210 may include bonding pads 212 on surface 208 (e.g., a ball grid array or other conductive interconnect structures) and coupled to driver circuitry 50. Metal layer 204 may include an RDL common anode (e.g., each LED 60 in monolithic array 40 may share a common anode on the driver integrated circuit regardless of whether the LEDs share a common anode on monolithic array 40 as shown in FIGS. 6 and 7) and/or other metal layers and interconnects. Conductive contact pads such as bond pads 214 may be formed on surface 206. Bond pads 214 (sometimes referred to herein as bonding pads 214) may, for example, include copper (Cu), tin (Sn), silver (Ag), SnAg, gold (Au), and/or any other desired metals or metal alloys. Conductive pillars such as copper pillars 216 may be grown on bond pads 214. Copper pillars 216 may include tips (e.g., opposite bond pads 214) that include solder balls, Sn/Ag, or other materials for bonding to other conductors. Nickel may be used to help adhere the solder to the copper pillars if desired.

As shown by arrow 211, monolithic array 40 may be flipped and contacts 200 and 202 of monolithic array 40 may be bonded to respective copper pillars 216 on driver integrated circuit 210 to form display structure 218 (sometimes referred to herein as display panel 218 or illumination panel 218). Material 201 may be provided between monolithic array 40 and driver integrated circuit 210 in display structure 218. Material 201 may include non-conductive paste applied over driver integrated circuit 210 prior to attaching (mounting) monolithic array 40 to copper pillars 216 or may include underfill material injected after monolithic array 40 has been attached (mounted) to copper pillars 216. In this way, monolithic array 40 may be bonded to driver integrated circuit 210 in a flip chip configuration. Surface 76 of substrate layer 62 faces driver integrated circuit 210. Contacts 202 and 204, bond pads 214, copper pillars 216, and metal layers 234 may form conductive interconnect structures 52 of FIG. 4, for example. In addition, each of the LEDs 60 in the array are monolithically and simultaneously mounted to driver integrated circuit 210 at the same time (e.g., because each of the LEDs 60 has already been formed on the same carrier such as substrate layer 62). This may, for example, require less precision and thus less manufacturing cost and complexity relative to scenarios where each LED is individually and sequentially mounted to the driver circuitry using metallic bonds (e.g., bonds with metallic pads on the driver integrated circuit in the absence of copper pillars 216).

Figure 21:
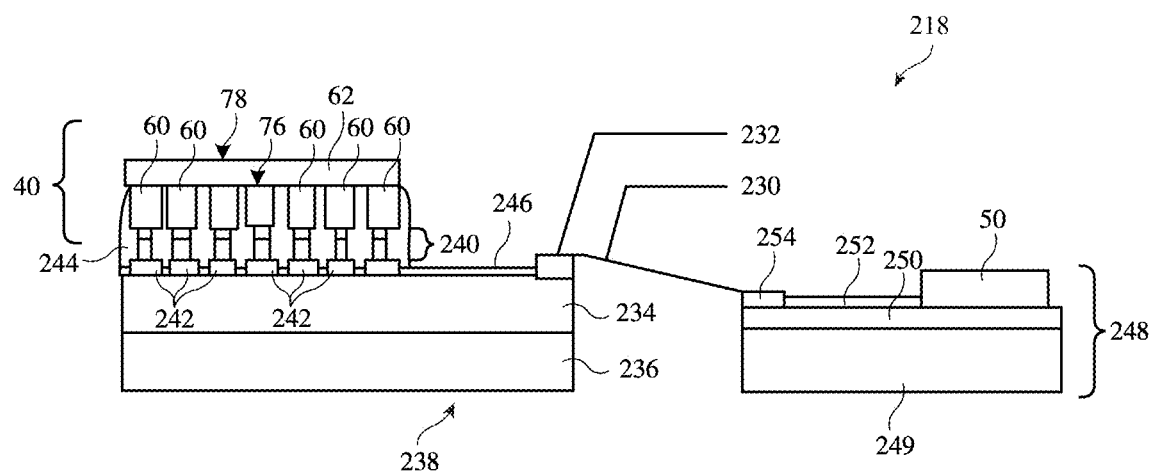
FIG. 21 is cross-sectional side view showing how an illustrative monolithic array of light sources may be bonded to copper pillars on an interposer that is coupled to a separate driver printed circuit board in accordance with some embodiments.

The example of FIG. 20 in which display structure 218 includes monolithic array 40 mounted to copper pillars 216 on driver integrated circuit 210 is merely illustrative. In another suitable arrangement, monolithic array 40 may be mounted to copper pillars on an interposer that is separate from the driver circuitry. FIG. 21 is a cross-sectional side view showing how monolithic array 40 may be mounted to copper pillars on an interposer that is separate from the driver circuitry.

As shown in FIG. 21, display structure 218 may include a substrate (e.g., an interposer structure) such as interposer 238. Display structure 218 may also include a driver printed circuit board (PCB) that is separate from interposer 238 such as driver PCB 248. Driver PCB 248 may include PCB substrate 249 and metal layers 250. Contact pads 254 and driver circuitry 50 may be coupled to metal layers 250. Metal layers 250 may route drive signals from driver circuitry 50 to contact pads 254. Optional passivation layer 252 may be provided over metal layers 250.

Interposer 238 may include interposer substrate 236 (sometimes referred to herein as dummy substrate 236). Interposer substrate 236 may be formed from silicon or any other desired materials. Interposer 238 may include metal layers 234. Conductive contact pads such as bond pads 242 and 232 may be formed on metal layers 234. Bond pads 232 may be coupled to contact pads 254 on driver PCB 248 over conductive path 230. Conductive path 230 may, for example, include conductive traces on a flexible printed circuit that couple bond pads 232 to contact pads 254. Conductive path 230 may convey drive signals from contact pads 254 to bond pads 232. Metal layers 234 may convey the drive signals from bond pads 232 to bond pads 242. Interposer 238 may include copper pillars 240 grown onto bond pads 242. Bond pads 242 may, for example, include copper (Cu), tin (Sn), silver (Ag), SnAg, gold (Au), and/or any other desired metals or metal alloys. Copper pillars 240 may include tips (e.g., opposite bond pads 214) that include solder, Sn/Ag, or other materials for bonding to other conductors. Optional passivation layer 246 may be provided over metal layers 234. If desired, metal layers 234 may include metal traces that fan out from a relatively small pitch at bond pads 242 to a wider pitch at bond pads 232.

Monolithic array 40 may be provided in a flip chip configuration and may be bonded to copper pillars 240 on interposer 238 (e.g., contacts 200 and 202 as shown in FIG. 20 may be bonded to copper pillars 240 on interposer 238). Surface 76 of substrate layer 76 faces interposer 238. Copper pillars 240 may convey drive signals from bond pads 242 to the LEDs 60 on monolithic array 40 (e.g., the contact pads on monolithic array 40, copper pillars 240, bonding pads 242, metal layers 234, bond pads 232, conductive path 230, contact pads 254, and metal layers 250 may for conductive interconnect structures 52 of FIG. 4). Material 244 may be provided between monolithic array 40 and interposer 238. Material 244 may include non-conductive paste applied over interposer 238 prior to attaching (mounting) monolithic array 40 to copper pillars 240 or may include underfill material injected after monolithic array 40 has been attached (mounted) to copper pillars 240.

In this way, each of the LEDs 60 in the array are monolithically and simultaneously mounted to interposer 238 at the same time (e.g., because each of the LEDs 60 have already been formed on the same carrier such as substrate layer 62). This may, for example, require less precision and thus less manufacturing cost and complexity relative to scenarios where each LED is individually and sequentially mounted to the driver circuitry using metallic bonds (e.g., bonds with metallic pads on the interposer in the absence of copper pillars 240). Coupling the driver circuitry to monolithic array 40 via conductive path 230 may allow the driver circuitry to be located relatively far from monolithic array 40 in system 10 (FIG. 1). This may, for example, allow the monolithic array to be located within a relatively small device while accommodating the presence of other device components that may not otherwise allow a driver integrated circuit to be bonded directly to the monolithic array (e.g., as shown in FIG. 20). The contact pads on monolithic array 40 of FIGS. 20 and 21 may be bonded directly to the copper pillars previously grown on interposer 238 or driver integrated circuit 210 (e.g., monolithic array 40 may be formed without copper pillars for coupling LEDs 60 to driver circuitry 50). By forming driver circuitry 50 on driver integrated circuit 210 or driver PCB 248, the driver circuitry is formed separately from monolithic array 40.

Figure 22:
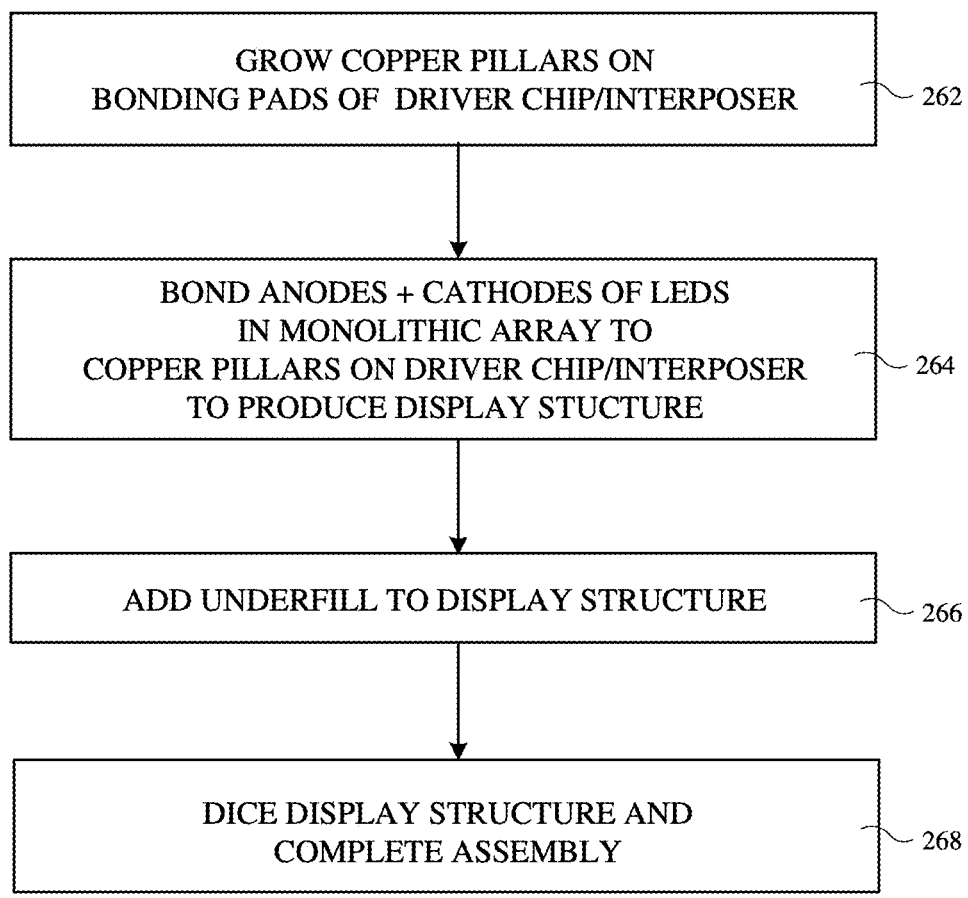
FIG. 22 is a flow chart of illustrative steps that may be performed in bonding an illustrative monolithic array of light sources to copper pillars on a driver integrated circuit or an interposer in accordance with some embodiments.

FIG. 22 is a flow chart of illustrative steps that may be performed to assemble display structure 218 of FIG. 20 or 21. The steps of FIG. 22 may, for example, be performed by manufacturing equipment in a manufacturing system.

At step 262, the manufacturing system may grow copper pillars 216 on bond pads 214 of driver integrated circuit 210

(FIG. 20) or may grow copper pillars 240 on bond pads 242 of interposer 238. The copper pillars may include solder bumps at the tips of the copper pillars (e.g., for bonding to contact pads on monolithic array 40).

At step 264, the manufacturing system may bond the anodes and/or cathodes (e.g., contacts 200 and/or 202 of FIGS. 20 and 21) of the LEDs 60 in monolithic array 40 (e.g., a monolithic array 40 provided with any desired combination of the features shown in FIGS. 4-21) to copper pillars 216 on driver integrated circuit 210 or to copper pillars 240 on interposer 238.

At step 266, the manufacturing system may add underfill material such as material 201 of FIG. 20 between monolithic array 40 and driver integrated circuit 210 or underfill material such as material 244 of FIG. 21 between monolithic array 40 and interposer 238.

At step 268, the manufacturing system may dice the display structure as needed and complete assembly of display module 14A of FIG. 2. In scenarios where monolithic array 40 is bonded to copper pillars 240 on interposer 238, the manufacturing system may also couple interposer 238 to driver PCB 248 using conductive path 230.

In accordance with an embodiment, a display system is provided that includes a reflective display panel configured to produce image light by spatially modulating illumination light, a monolithic array configured to emit the illumination light, the monolithic array including a substrate layer, and an array of light-emitting diodes on a surface of the substrate layer, the array of light-emitting diodes being configured to emit the illumination light through the substrate layer, and a driver integrated circuit that is separate from the monolithic array and that includes driver circuitry, the driver circuitry is configured to generate drive signals that control the monolithic array to emit the illumination light.

In accordance with another embodiment, the display system includes bond pads on a surface of the driver integrated circuit, and copper pillars on the bond pads, the array of light-emitting diodes in the monolithic array includes contact pads that are bonded to the copper pillars.

In accordance with another embodiment, the driver integrated circuit includes metal layers that couple the display driver circuitry to the bond pads.

In accordance with another embodiment, the monolithic array is bonded to the copper pillars in a flip-chip configuration.

In accordance with another embodiment, the display system includes an underfill material between the monolithic array and the driver integrated circuit.

In accordance with another embodiment, each light-emitting diode in the array of light-emitting diodes includes a respective p contact pad and a respective n contact pad.

In accordance with another embodiment, each light-emitting diode in the array of light-emitting diodes includes a respective p contact pad and a set of the light-emitting diodes in the array of light-emitting diodes shares a common n contact pad.

In accordance with another embodiment, the substrate layer includes sapphire.

In accordance with another embodiment, the array of light-emitting diodes includes light-emitting diodes selected from the group consisting of: micro light-emitting diodes, mini light-emitting diodes, and organic light-emitting diodes.

In accordance with another embodiment, the display system includes light redirecting elements formed in a surface of the substrate layer.

In accordance with another embodiment, the driver circuitry is configured to independently control, using the drive signals, an intensity of each of the light-emitting diodes in the array of light-emitting diodes.

In accordance with an embodiment, a display system is provided that includes a dielectric carrier layer having opposing first and second surfaces, an array of light-emitting diodes on the first surface of the dielectric carrier layer, the array of light-emitting diodes is configured to emit light through the dielectric carrier layer and each light-emitting diode in the array of light-emitting diodes includes a respective contact pad, a substrate having bond pads and copper pillars on the bond pads, the contact pads in the array of light-emitting diodes are bonded to the copper pillars and the first face of the dielectric carrier layer faces the substrate, and driver circuitry configured to control the array of light-emitting diodes using drive signals conveyed through the copper pillars.

In accordance with another embodiment, the substrate includes a driver integrated circuit and the driver integrated circuit includes the driver circuitry.

In accordance with another embodiment, the substrate includes an interposer, the display system includes a driver printed circuit board, the driver circuitry is on the driver printed circuit board, and a flexible printed circuit that couples the driver printed circuit board to the interposer, the flexible printed circuit is configured to convey the drive signals from the driver printed circuit board to the interposer.

In accordance with another embodiment, the second surface of the dielectric carrier layer includes a plurality of light redirecting elements, the plurality of light redirecting elements being configured to disrupt a total internal reflection mode of the dielectric carrier layer.

In accordance with another embodiment, the dielectric carrier layer includes trenches between adjacent light-emitting diodes in the array of light-emitting diodes, the trenches extending from the second surface towards the first surface of the dielectric carrier layer.

In accordance with another embodiment, the dielectric carrier layer includes trenches between adjacent light-emitting diodes in the array of light-emitting diodes, the trenches extending from the second surface towards the first surface of the dielectric carrier layer, and the trenches being configured to at least partially collimate the light emitted by the array of light-emitting diodes.

In accordance with another embodiment, the second surface of the dielectric carrier layer includes protruding structures between adjacent light-emitting diodes in the array of light-emitting diodes.

In accordance with another embodiment, the second surface of the dielectric layer includes a respective lens element overlapping each of the light-emitting diodes in the array of light-emitting diodes, the lens elements being configured to focus the light emitted by the array of light-emitting diodes.

In accordance with an embodiment, a display system is provided that includes a reflective display panel configured to produce image light by spatially modulating illumination light, a monolithic array configured to emit the illumination light, the monolithic array including a substrate layer, and an array of light-emitting diodes on a surface of the substrate layer, the array of light-emitting diodes being configured to emit the illumination light through the substrate layer, an interposer, the array of light-emitting diodes in the monolithic array are mounted to the interposer, a flexible printed circuit coupled to the interposer, and a driver printed circuit board coupled to the flexible printed circuit and having driver circuitry, the driver circuitry is configured to provide drive signals to the array of light-emitting diodes through the flexible printed circuit and the interposer.

In accordance with another embodiment, the interposer includes copper pillars at a surface of the interposer and the array of light-emitting didoes in the monolithic array are bonded to the copper pillars.

In accordance with an embodiment, a display system is provided that includes a substrate layer having opposing first and second surfaces, an array of light-emitting diodes on the first surface of the substrate layer, the array of light-emitting diodes is configured to emit light through the substrate layer and the array of light-emitting diodes includes contact pads, a driver integrated circuit bonded to the contact pads and including driver circuitry configured to drive the array of light-emitting diodes, and trenches in the substrate layer and extending between adjacent light-emitting diodes in the array of light-emitting diodes, the second surface of the substrate layer is patterned to form a respective microlens array overlapping each light-emitting diode in the array of light-emitting diodes.

The foregoing is merely illustrative and various modifications can be made to the described embodiments. The foregoing embodiments may be implemented individually or in any combination.

What is claimed is:

1. A display system comprising:
   a reflective display panel configured to produce image light by spatially modulating illumination light;
   a monolithic array configured to emit the illumination light, the monolithic array comprising:
     a substrate layer having a first surface and a second surface opposite the first surface, wherein the first surface is a planar surface that extends continuously across the array of light-emitting diodes,
     an array of light-emitting diodes on the first surface of the substrate layer, the array of light-emitting diodes being configured to emit the illumination light through the substrate layer, and
     trenches in the substrate layer, wherein the trenches extend between adjacent light-emitting diodes in the array and extend, from the second surface towards the first surface, across some but not all of a thickness of the substrate layer; and
   driver circuitry configured to generate drive signals that control the monolithic array to emit the illumination light.

2. The display system of claim 1, further comprising:
   a driver integrated circuit that is separate from the monolithic array and that includes the driver circuitry;
   bond pads on a surface of the driver integrated circuit; and
   copper pillars on the bond pads, wherein the array of light-emitting diodes in the monolithic array comprises contact pads that are bonded to the copper pillars.

3. The display system of claim 2, wherein the driver integrated circuit comprises metal layers that couple the driver circuitry to the bond pads.

4. The display system of claim 2, wherein the monolithic array is bonded to the copper pillars in a flip-chip configuration.

5. The display system of claim 2, further comprising an underfill material between the monolithic array and the driver integrated circuit.

6. The display system of claim 2, wherein each light-emitting diode in the array of light-emitting diodes comprises a respective p contact pad and a respective n contact pad.

7. The display system of claim 2, wherein each light-emitting diode in the array of light-emitting diodes comprises a respective p contact pad and wherein a set of the light-emitting diodes in the array of light-emitting diodes shares a common n contact pad.

8. The display system of claim 1, wherein the substrate layer comprises sapphire.

9. The display system of claim 1, wherein the array of light-emitting diodes comprises light-emitting diodes selected from the group consisting of: micro light-emitting diodes, mini light-emitting diodes, and organic light-emitting diodes.

10. The display system of claim 1, wherein the driver circuitry is configured to independently control, using the drive signals, an intensity of each of the light-emitting diodes in the array of light-emitting diodes.

11. The display system of claim 1, wherein each light-emitting diode in the array of light-emitting diodes comprises a respective contact pad, the display system further comprising:
   a substrate having bond pads and copper pillars on the bond pads, wherein the contact pads in the array of light-emitting diodes are bonded to the copper pillars, wherein the first surface faces the substrate, and wherein the drive signals are conveyed through the copper pillars.

12. The display system of claim 11, further comprising:
   a driver integrated circuit, wherein the driver integrated circuit comprises the driver circuitry.

13. The display system of claim 11, further comprising:
   an interposer;
   a driver printed circuit board, wherein the driver circuitry is on the driver printed circuit board; and
   a flexible printed circuit that couples the driver printed circuit board to the interposer, wherein the flexible printed circuit is configured to convey the drive signals from the driver printed circuit board to the interposer.

14. The display system of claim 11, wherein the second surface comprises a respective lens element overlapping each of the light-emitting diodes in the array of light-emitting diodes, the lens elements being configured to focus the light emitted by the array of light-emitting diodes.

15. The display system of claim 1, wherein the trenches are configured to disrupt a total internal reflection mode of the substrate layer.

16. The display system of claim 1, further comprising:
   an interposer, wherein the array of light-emitting diodes in the monolithic array is mounted to the interposer;
   a flexible printed circuit coupled to the interposer; and
   a driver printed circuit board coupled to the flexible printed circuit and comprising the driver circuitry, wherein the driver circuitry is configured to provide the drive signals to the array of light-emitting diodes through the flexible printed circuit and the interposer, wherein the interposer comprises copper pillars at a surface of the interposer and wherein the array of light-emitting diodes in the monolithic array is bonded to the copper pillars.

17. The display system of claim 1, wherein the second surface is a planar surface.

18. The display system of claim 1, wherein the trenches have ends facing the first surface and wherein the trenches have a rectangular profile with straight sidewalls that extend from the second surface to the ends.

19. The display system of claim 1, wherein the trenches are filled with a material other than air.

20. A display system comprising:
a reflective display panel configured to produce image light by spatially modulating illumination light;
a monolithic array configured to emit the illumination light, the monolithic array comprising:
   a substrate layer having opposing first and second surfaces, and
   an array of light-emitting diodes on the first surface of the substrate layer, wherein the array of light-emitting diodes is configured to emit the illumination light through the substrate layer and wherein the second surface of the substrate layer comprises protruding structures between adjacent light-emitting diodes in the array of light-emitting diodes; and
driver circuitry configured to generate drive signals that control the monolithic array to emit the illumination light.

21. The display system of claim 20, wherein the protruding structures have a triangular shape, a trapezoidal shape, or a curved shape.

22. An electronic device comprising:
a display panel configured to spatially modulate illumination light to produce light that carries images; and
a monolithic array configured to emit the illumination light, wherein the monolithic array includes
   a substrate layer having a first surface and a second surface opposite the first surface, and
   an array of light-emitting diodes at the first surface, wherein the array of light-emitting diodes is configured to emit the illumination light through the substrate layer and wherein the second surface comprises protruding structures between adjacent light-emitting diodes in the array of light-emitting diodes.

* * * * *